United States Patent
Chan et al.

(10) Patent No.: US 11,636,388 B1
(45) Date of Patent: Apr. 25, 2023

(54) MACHINE LEARNING-BASED ALGORITHM TO ACCURATELY PREDICT DETAIL-ROUTE DRVS FOR EFFICIENT DESIGN CLOSURE AT ADVANCED TECHNOLOGY NODES

(71) Applicant: Synopsys, Inc., Mountain View, CA (US)

(72) Inventors: Wei-Ting Chan, Hillsboro, OR (US); Siddhartha Nath, Mountain View, CA (US); Vishal Khandelwal, Hillsboro, OR (US)

(73) Assignee: Synopsys, Inc., Mountain View, CA (US)

( * ) Notice: Subject to any disclaimer, the term of this patent is extended or adjusted under 35 U.S.C. 154(b) by 421 days.

(21) Appl. No.: 16/782,018

(22) Filed: Feb. 4, 2020

Related U.S. Application Data

(60) Provisional application No. 62/800,815, filed on Feb. 4, 2019.

(51) Int. Cl.
*G06N 20/00* (2019.01)
*G06F 30/398* (2020.01)
(Continued)

(52) U.S. Cl.
CPC ........... *G06N 20/00* (2019.01); *G06F 30/323* (2020.01); *G06F 30/327* (2020.01);
(Continued)

(58) Field of Classification Search
CPC ..... G06N 20/00; G06F 30/323; G06F 30/327; G06F 30/3947; G06F 30/3953; G06F 30/398
See application file for complete search history.

(56) References Cited

U.S. PATENT DOCUMENTS

| | | | |
|---|---|---|---|
| 11,003,826 B1 * | 5/2021 | Dasasathyan | G06F 30/392 |
| 11,194,949 B1 | 12/2021 | Saxena et al. | |
| 2020/0104457 A1 * | 4/2020 | Chuang | G06F 30/392 |

FOREIGN PATENT DOCUMENTS

WO    WO 2019/005562 A1    1/2019

OTHER PUBLICATIONS

"Design Rule Violation Hotspot Prediction Based on Neural Network Ensembles", by Wei Zeng, Azadeh Davoodi, and Yu Hen Hu, arXiv, Nov. 9, 2018.*

(Continued)

*Primary Examiner* — Nha T Nguyen
(74) *Attorney, Agent, or Firm* — Weaver Austin Villeneuve & Sampson LLP

(57) ABSTRACT

A machine learning (ML) system is trained to predict the number of design rules violations of a circuit design that includes a multitude of Gcells. To achieve this, a netlist associated with the circuit design is placed by a place and route tool. A first list of features associated with the placed netlist is delivered to the ML system. A global route of the circuit design is performed by a global router. Next, a second list of features is delivered from the global router to the ML system. Thereafter, a detailed route of the circuit design is performed by a detailed router. A label associated with each Gcell in the circuit design is delivered to the ML system from the detailed route. The ML system is trained using the first and second list of features and the labels.

29 Claims, 16 Drawing Sheets

(51) Int. Cl.
  *G06F 30/323* (2020.01)
  *G06F 30/3953* (2020.01)
  *G06F 30/327* (2020.01)
  *G06F 30/3947* (2020.01)

(52) U.S. Cl.
  CPC ........ *G06F 30/398* (2020.01); *G06F 30/3947* (2020.01); *G06F 30/3953* (2020.01)

(56) References Cited

OTHER PUBLICATIONS

Zeng, et al., "Design Rule Violation Hotspot Prediction Based on Neural Network Ensembles,", Computer Science Machine Learning, airXiv:1811.04151, (Nov. 9, 2018).

Daulagala, et al., "Early Stage Integrated Circuit Design Efficacy Prediction using Congestion and Cell Density Maps," NVIDIA Corporation, Santa Clara, CA, retrieved from internet at: //cs231n.stanford.edu/reports/2017/pdfs/536.pdf, on Feb. 5, 2019.

Xie, et al., "RouteNet: Routability prediction for Mixed-Size Designs Using Convolutional Neural Network," *2018 IEEE/ACM International Conference on Computer-Aided Design (ICCAD)*, San Diego, CA, 2018, pp. 1-8.

Chan, Wei-Ting J., et al., "BEOL Stack-Aware Routability Prediction from Placement Using Data Mining Techniques," Proc. IEEE Intl. Conf. on Computer Design, 2016, pp. 41-48 [doi: 10.1109/ICCD.2016.7753259].

\* cited by examiner

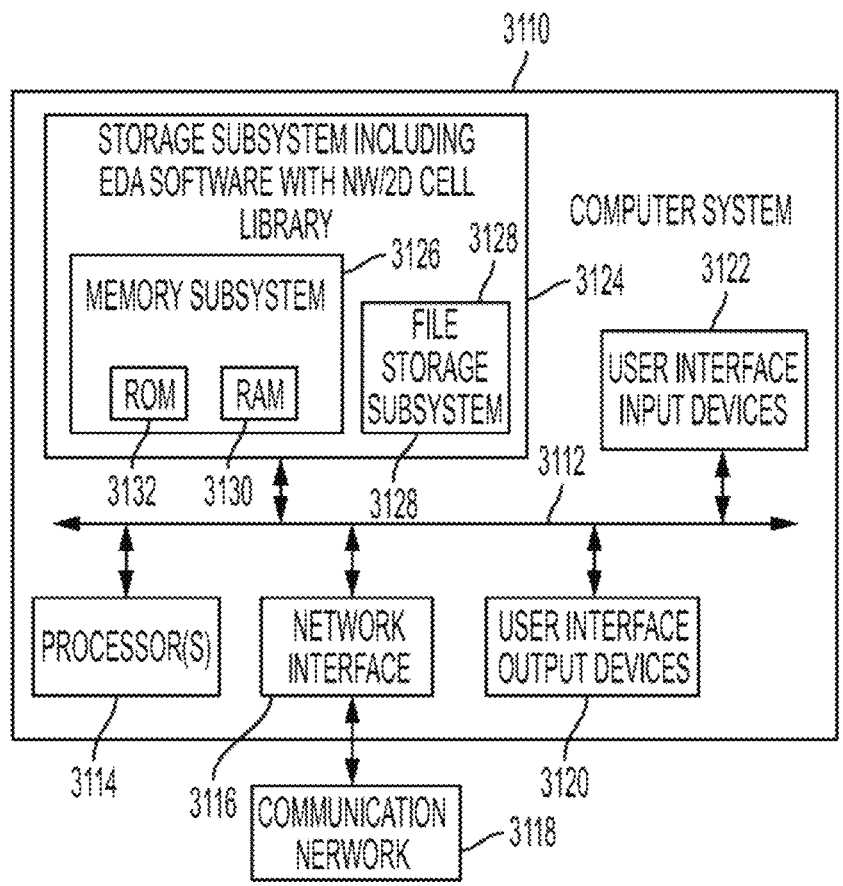
FIG. 12A
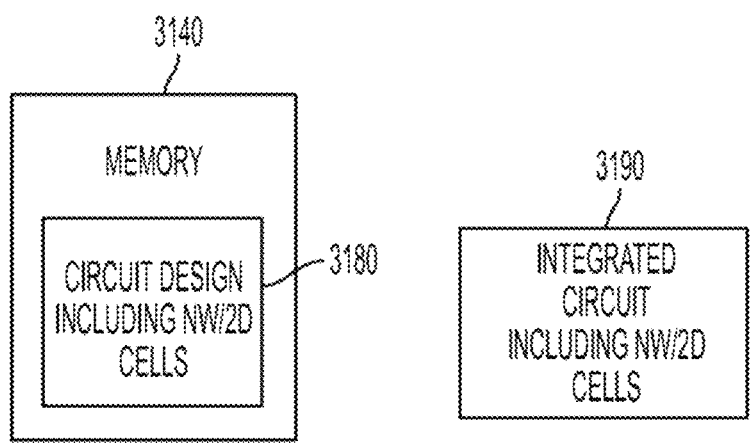
FIG. 12B
FIG. 12C

MACHINE LEARNING-BASED ALGORITHM TO ACCURATELY PREDICT DETAIL-ROUTE DRVS FOR EFFICIENT DESIGN CLOSURE AT ADVANCED TECHNOLOGY NODES

CROSS-REFERENCE TO RELATED APPLICATION

The present application claims benefit under 35 USC 119(e) of Application Ser. No. 62/800,815, filed Feb. 4, 2019, the content of which is incorporated herein by reference in its entirety.

COPYRIGHT NOTICE

The assignee of this patent document has no objection to the facsimile reproduction by anyone of the patent document itself, or of the patent application, as it appears in the files of the United States Patent and Trademark Office, but otherwise reserves all rights whatsoever in any included works of authorship protected by copyright.

SPECIFICATION—DISCLAIMER

In the following Background, Summary, and Detailed Description, headings should not be construed as necessarily limiting. In the following Background, Summary and Detailed Description, the citation or identification of any publication does not signify relevance or status as prior art for any of the claimed or described embodiments. Paragraphs for which the text is all italicized signifies text that is common to multiple Synopsys patent specifications.

BACKGROUND

Complexity of routing rules at advanced technology nodes (e.g., 7 nm and below) makes global route (GR) increasingly miscorrelated with detail route (DR). Due to the prohibitively high runtime for DR and synthesis, place & route (P&R) tools use GR and congestion maps/hotspots to identify and resolve DRVs. Consequently, physical design tools are facing performance, power, and area (PPA) closure challenges at advanced nodes due to the large miscorrelation between GR congestion maps and DRVs.

Tackling GR-DR miscorrelation poses challenges for conventional rule-based algorithms. Design rules and standard cell layouts in advanced nodes are increasingly complex compared to previous nodes. Design rules and cell layouts may also have variations in the same node (e.g., 7 nm vs. 7 $nm^+$). Development cycles of design rules are significantly longer in advanced nodes and the complexity of these rules are growing at an exponential rate, as shown in FIGS. 1A and 1B. Hence, closing the gap between GR and DR is a fast-moving target.

Furthermore, different design vendors may select their own subset of standard cells from the same foundry technology. Without tailoring P&R tools for customers, the difficulty to achieve optimum PPA will be time-consuming and resource-draining. Therefore, discovering such violations near the end of the flow (i.e., at detail route) leads to multiple days of wasted tool runs, and turnaround time as designers fix upfront flow elements and rerun the flow. A need continues to exist for an improved algorithm and models that can predict DRVs early in the flow so as to enable efficient re-training of the model and reduce the turn-around time.

SUMMARY

The claims signify a brief description of one or more of the innovations, embodiments, and/or examples found within this disclosure.

In accordance with one embodiment of the present invention, a machine learning (ML) system is trained to predict the number of design rules violations of a circuit design that includes a multitude of Gcells. In one embodiment, the method includes placing a netlist associated with the first circuit design by a place and route tool, delivering a first list of features associated with the placed netlist to the ML system, performing a global route of the first circuit design by a global router, delivering a second list of features from the global router to the ML system, performing a detailed route of the first circuit design by a detailed router, providing a label associated with each Gcell in the first circuit design to the ML system, and training the ML system using the first and second list of features and the labels.

In one embodiment, the first list includes one or more of a number of buried nets, number of non-buried nets, pin proximity, number of flip-flops, pin density, cell density, power distribution network, via pillar density, number of nets with non-default rules, number of nets on critical paths.

In one embodiment, the second list includes one or more of a number of nets to route in a region, capacity of nets to route in a region, a difference between the number of nets to route in a region and the capacity of the nets to route in the region, and an anchor point. The trained ML system is used to predict a number of design rules violations of another circuit design.

In one embodiment, the method further includes normalizing at least a subset of features of the first feature list to scale values of the features in the subset. In one embodiment, the method further includes normalizing at least a subset of features of the second feature list to scale values of the features in the subset. In one embodiment, the method further includes categorizing the Gcells based on a number of design rules violations associated with each Gcell.

In one embodiment, the method further includes upsampling a subset of the labels. In one embodiment, the method further includes eliminating features, from the first list, whose variations is smaller than a predefined value. In one embodiment, the method further includes eliminating features, from the second list, whose variations is smaller than a predefined value. In one embodiment, the method further includes selecting features, from the first list, whose degree of correlations with the design rules violations is greater than a predefined value. In one embodiment, the method further includes selecting features, from the second list, whose degree of correlations with the design rules violations is greater than a predefined value.

In one embodiment, the method further includes training the ML system using the selected features. In one embodiment, the method further includes integrating the ML system with a place and route tool. In one embodiment, the method further includes using the ML system to determine an expansion or shrinkage factor of a cell disposed in the design.

A machine learning (ML) system, in accordance with one embodiment of the present invention is configured to receive a first list of features associated with a placed netlist of a circuit design comprising a plurality of Gcells, receive a second list of features from a global router performing a global route of the circuit design, receive a label associated with each Gcell in the circuit design from a detailed router performing a detailed route of the circuit design, and predict a number of design rules violations of the circuit design in accordance with the received first and second lists and the labels.

In one embodiment, the first list includes one or more of a number of buried nets, number of non-buried nets, pin proximity, number of flip-flops, pin density, cell density, power distribution network, via pillar density, number of nets with non-default rules, number of nets on critical paths of the circuit design. In one embodiment, the second list includes one or more of a number of nets to route in a region, capacity of nets to route in a region, a difference between the number of nets to route in a region and the capacity of the nets to route in the region, and an anchor point of the circuit design. The ML system is further configured to predict a number of design rules violations of another circuit design.

In one embodiment, the ML system is further configured to normalize at least a subset of features of the first feature list to scale values of the features in the subset. In one embodiment, the ML system is further configured to normalize at least a subset of features of the second feature list to scale values of the features in the subset. In one embodiment, ML system is further configured to categorize the Gcells based on a number of design rules violations associated with each Gcell.

In one embodiment, the ML system is further configured to upsample a subset of the labels. In one embodiment, the ML system is further configured to eliminate features, from the first list, whose variations is smaller than a predefined value. In one embodiment, the ML system is further configured to eliminate features, from the second list, whose variations is smaller than a predefined value.

In one embodiment, the ML system is further configured to select features, from the first list, whose degree of correlations with the design rules violations is greater than a predefined value. In one embodiment, the ML system is further configured to select features, from the second list, whose degree of correlations with the design rules violations is greater than a predefined value. In one embodiment, the ML system is integrated with the place and route tool. In one embodiment, the ML system is further configured to determine an expansion or shrinkage factor of a cell disposed in the design.

This Summary does not attempt to completely signify any particular innovation, embodiment, or example as it can be used in commerce. Additionally, this Summary is not intended to signify essential elements of an innovation, embodiment or example or to limit the scope of the subject matter of this disclosure.

The innovations, embodiments, and/or examples found within this disclosure are not all-inclusive, but rather describe the basic significance of the subject matter. Accordingly, one use of this Summary is as a prelude to a Detailed Description presented later.

DRAWINGS

The following Detailed Description, Figures, appended Additional Figures and appended Claims signify the nature and advantages of the innovations, embodiments and/or examples of the claimed inventions. All of the Figures signify innovations, embodiments, and/or examples of the claimed inventions for purposes of illustration only and do not limit the scope of the claimed inventions. Such Figures are not necessarily drawn to scale, and are part of the Disclosure.

In the Figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes among the similar components. If only the first reference label is used in the specification, the description is applicable to any one of the similar components having the same first reference label irrespective of the second reference label. A brief description of the Figures is below.

FIGS. 12A, 12B and 12C are simplified block diagrams of a computer system suitable for use with embodiments of the technology, as well as circuit design and circuit embodiments of the technology.

DETAILED DESCRIPTION

Figure 1A:
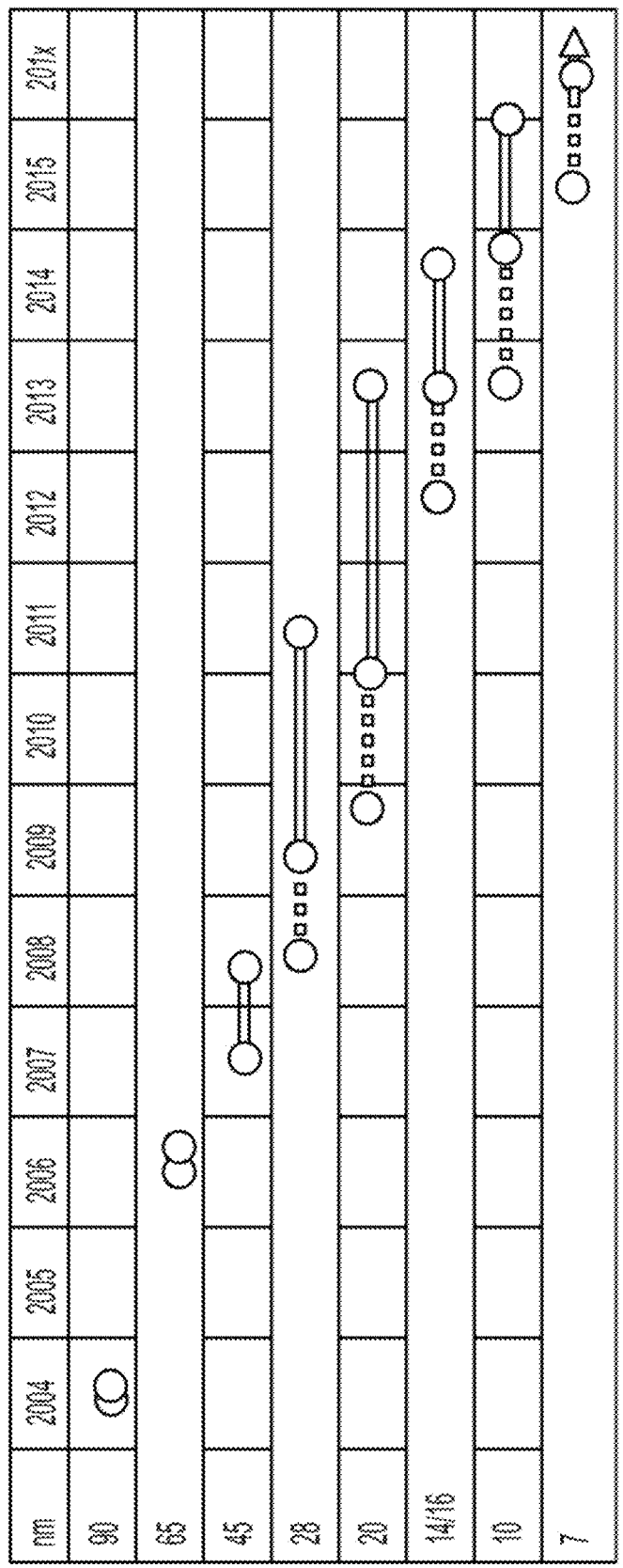
FIG. 1A shows the increase in development cycle of design as a function of the minimum feature size of a semiconductor manufacturing process used to manufacture the circuit, as known in the prior art.
Figure 1B:
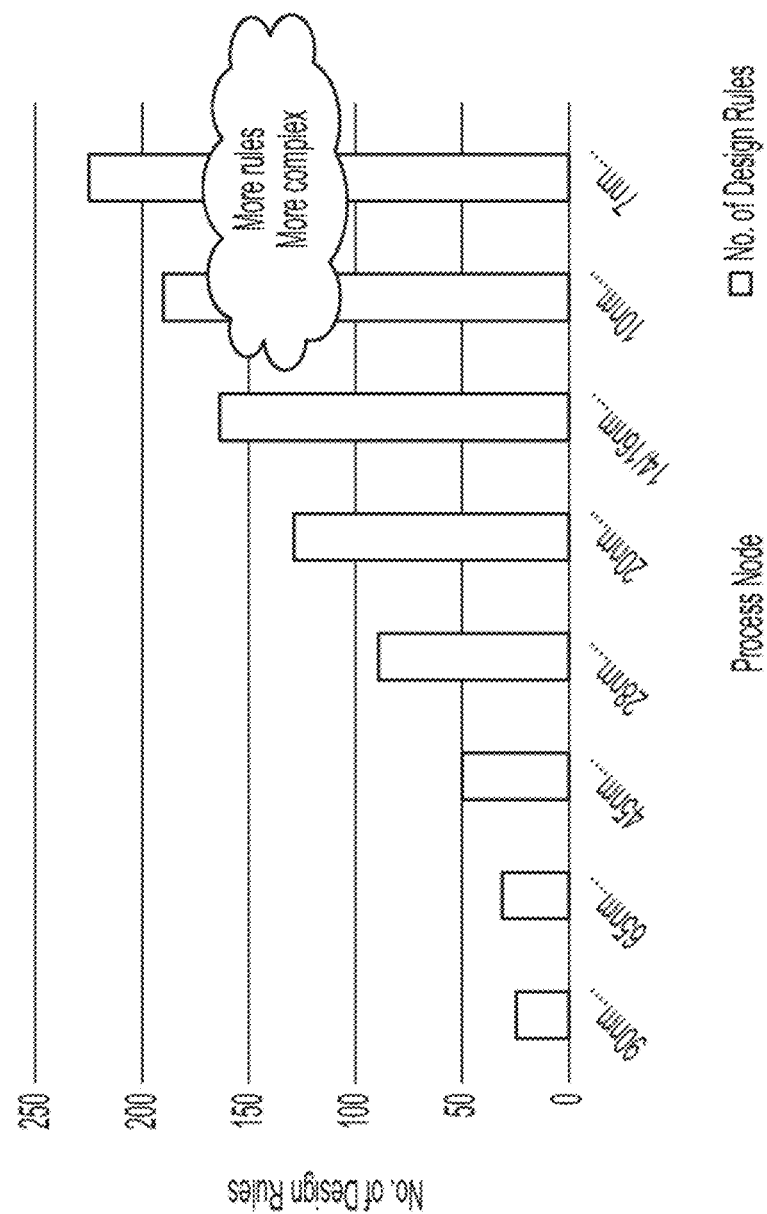
FIG. 1B shows the increase in the number of design rules violations as a function of the minimum feature size of the semiconductor manufacturing process, as known in the prior art.

The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to enable one or more of the exemplary innovations, embodiments and/or examples. In the interest of not obscuring the presentation of the exemplary innovations, embodiments and/or examples in the following Detailed Description, some processing steps or operations that are known in the art may be combined together for presentation and for illustration purposes and might not be described in detail. However, a person skilled in the art will recognize that these exemplary innovations, embodiments and/or examples may be used in commerce without these specific details or with equivalents thereof. In other instances, well-known processes and devices are not described in detail as not to unnecessarily obscure aspects of these exemplary innovations, embodiments and/or examples. In other instances, some processing steps or operations that are known in the art may not be described at all. Instead, the following description is focused on the distinctive features or elements of various exemplary innovations, embodiments and/or examples. Furthermore, while this description may refer to some components of the structure in the singular tense, more than one component may be depicted throughout the Figures and like components are labeled with like numerals.

In the present application, it is understood that:

TensorFlow refers to a high-performance software infrastructure for neural network;

Global routing (GR) refers to a routing that finds tile-to-tile paths for all nets on the global-routing graph to guide the detailed router;

Detail routing (DR) refers to a routing that determines the exact tracks and vias for nets, the detail router needs to be aware of design rules to avoid design rule violations (DRVs);

Gcells refer to rectangular global cells used in P&R;

DRV refers to design rule violations;

PPA refers to performance, power, and area;

DRVs at early (pre-route) physical design flow stage refers to estimating the geometric occurrences and severity of DRVs before running detailed route;

DRV prediction accuracy refers to the portion of Gcells predicted to have correct DRV severities among all Gcells; and Back-end-of-line stack refers to the metal stack used to route signal and power nets after standard cells are placed;

GR demand refers to the number of nets to route in a given region;

GR supply refers to the capacity of nets to route in a given region;

GR overflow refers the difference between GR demand and supply, usually used as the indicator of congestion; and Glink refers to the anchor point used by router.

Physical design refers to the steps performed in a VLSI design flow, where circuit representations of various components (both devices and interconnects) are converted into geometric representations of shapes which, when manufactured in the corresponding layers of materials, will ensure the components function as specified.

In accordance with embodiments of the present invention, a machine learning (ML) based algorithm accurately predicts DRVs at early, pre-route physical design and achieves substantial improvement in DRV prediction accuracy.

Figure 2:
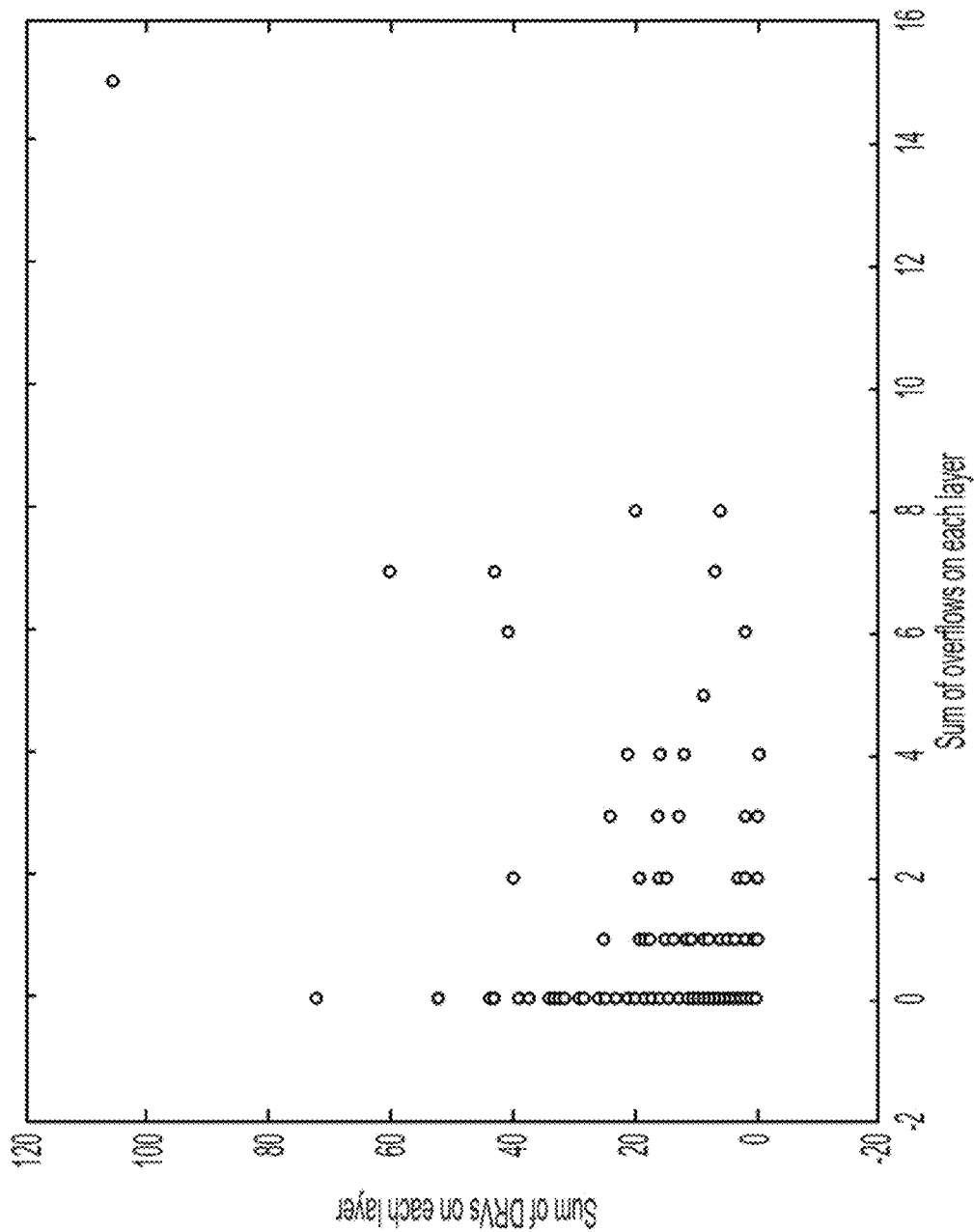
FIG. 2 shows the miscorrelation between GR overflow and design rules violations, as known in the prior art.

Conventionally, global routers use overflows from congestion maps to predict DRVs. However, such technique have large prediction errors. FIG. 2 shows exemplary prediction errors as indicated by the degree of miscorrelation between actual DRVs at DR and overflows at GR obtained by the IC place and route tool, such as the ICC2 tool commercially available from Synopsys corporation.

Figure 3A:
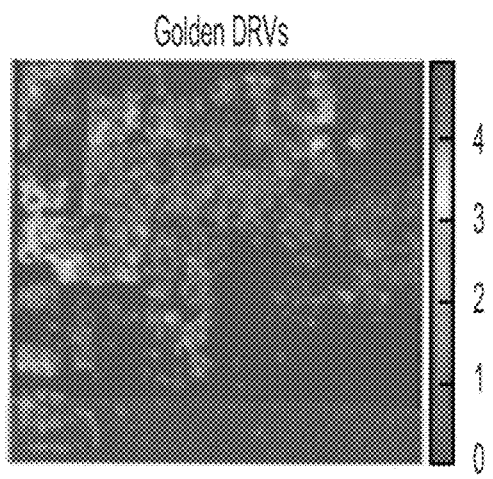
FIG. 3A is a heatmap of golden DRVs associated with a circuit design formed using a 7 nm semiconductor manufacturing process.
Figure 3B:
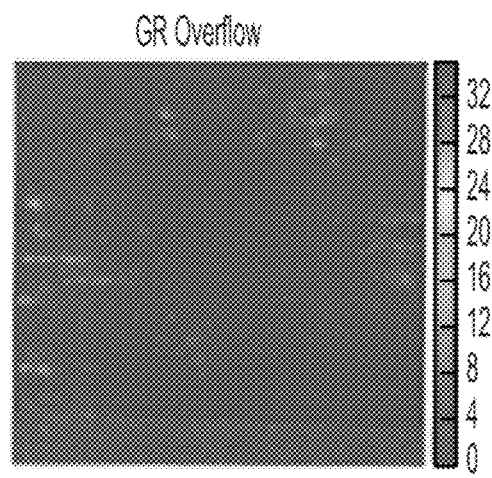
FIG. 3B is a heatmap of a GR overflow associated with the circuit design of FIG. 3A and formed using a 7 nm semiconductor manufacturing process.

FIGS. 3A and 3B respectively are heatmaps of golden DRVs (known to be correct at obtained at DR), and GR overflows (obtained at GR) generated by the ICC2 tool from a circuit design formed using a 7 nm semiconductor manufacturing process. As is seen from these Figures, the GR overflow heatmap correlates poorly with the golden DRVs.

Embodiments of the present invention accurately predict DRVs early in the design flow using information available at the GR together with design features that correlate well with the DR-DRV at advanced nodes. Features supplied by a place and route tool include, but are not limited to, number of buried nets/non-buried nets, unfriendly cells, pin proximity, number of flip-flops, pin density, cell density, power distribution network, via pillar density, number of nets with non-default rules, number of nets on critical paths, and the like. Unfriendly cells are understood to refer to cells that create relatively higher routing difficulties due to such factors as, for example, higher pin count, smaller footprints, less whitespace among pins for routing. Examples of unfriendly cells includes multiplexers, AOI (AND OR INVERTER), OAI (OR AND INVERTER), and the like. Features supplied by a GR tool include, but are not limited to, GR overflow, GR demand/supply, number of Glink segments on GR nets that violate min area rules. Embodiments of the present invention therefore mitigate the miscorrelations shown in FIGS. 3A and 3B.

Embodiments of the present invention may be used as a standalone analysis tool to enable a user to perform a DR-correlated congestion analysis of a design. Embodiments of the present invention may also be integrated into the physical design flow (such as placement, legalization, optimization and global routing) to identify and resolve DR-DRV, thereby enabling a single-pass convergence.

In accordance with one embodiment of the present invention, a multi-class classifier is developed to predict DRV severity. As is known, DRV severities are indicative of whether a design is routable. The presence of severe DRVs requires early adjustments to the design (e.g., by changing placement) to render the design routable. The multi-class classification enables the up-sampling of the DRV Gcells to overcome the class unbalance. Embodiments of the present invention use neural network to, among other advantages, (i) handle the highly non-linear and the high-dimensional prediction challenges, and (ii) automatically discover hidden features from input model features. By discovering the hidden features, embodiments of the present invention are adapted to model non-obvious interactions among features that cause DRVs. In accordance with another aspect, embodiments of the present invention use sliding windows and windows with different window sizes to extract model features, thereby to capture the influence of Gcells on neighboring Gcells.

Figure 4A:
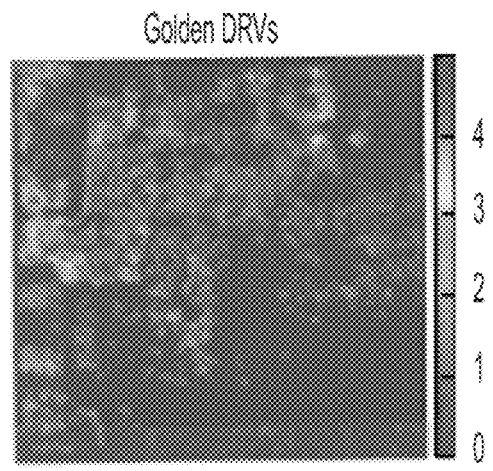
FIG. 4A is a heatmap of golden DRVs associated with a circuit design formed using a 7 nm semiconductor manufacturing process.
Figure 4B:
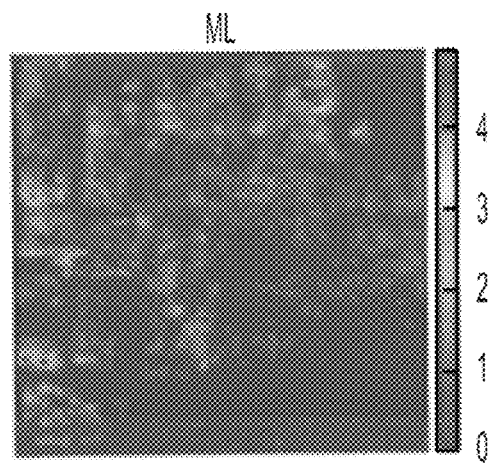
FIG. 4B is a heatmap generated using a trained ML system, in accordance with one embodiment of the present invention, for the same circuit as shown in FIG. 4A.

In accordance with one aspect of the present invention, a machine learning (ML) system is trained to predict DRVs using actual DRV data at DR, and features at GR. FIG. 4A is a heatmap of golden DRVs of a design and is identical to the heatmap shown in FIG. 3A. FIG. 4B is a heatmap generated using a trained ML system, in accordance with one embodiment of the present invention, for the same circuit of FIG. 4A and processed using a 7 nm semiconductor manufacturing process.

As is known, DRVs can occur on any of the metal layers used in a semiconductor manufacturing process. In one embodiment, the DRVs from different metal layers are added for each Gcell. For example, if a semiconductor processing has four metal layers M1, M2, M3 and M4, respectively having 150, 100, 50 and 0 DRVs in a Gcell, then the number of DRVs for the Gcell is 300.

To train the ML system to predict DRV, features that are highly correlated with the occurrence and severity of DRVs are selected using information that is available only at GR; none of the features are obtained from DR. The features cover aspects that can predict violations of complex design rules that the DR tool is aware of Such feature include but are not limited to GR overflow, GR demand/supply, number of buried nets/non-buried nets, unfriendly cells, pin proximity, number of flip-flops, pin density, cell density, power distribution network, via pillar density, number of nets with non-default rules, number of Glink segments on GR nets that violate minimum area rules, number of nets on critical paths, and the like, captured using expandable and sliding windows of a basic placement Gcell.

Figure 5A:
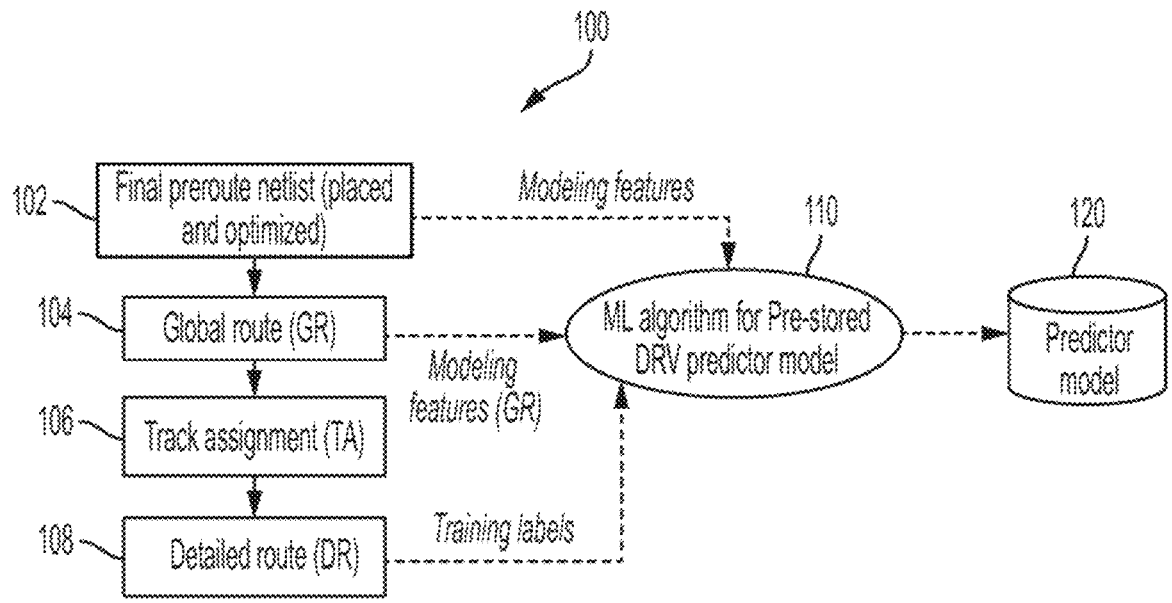
FIG. 5A is a simplified flowchart of activities performed in training an ML-based DRV prediction system, in accordance with one embodiment of the present invention.

FIG. 5A is a simplified flowchart 100 showing various activities in generating an ML-based DRV prediction model, in accordance with one embodiment of the present invention. At 102, the pre-route netlist of various component of a design, such as I/Os, processing blocks, standard cells, and the like, are placed and their position, subject to minor modification and incremental changes, are substantially fixed. At 104 GR is performed, and at 106 track assignment is completed. As is known, tracks are metal traces connecting standard cells and other components of the design to one another. At 108 the DR is performed while satisfying the spacing rules. Features, such as pin density, cell density, and the like, as listed above, are also supplied to ML-based prediction algorithm 110 by the placement and route tool at 102. Features such as GR overflow, GR demand/supply, and the number of Glink segments on GR nets that violate min area rules are supplied to ML-based prediction algorithm 110 by the GR tool at 104.

The training labels that are also used to train the prediction algorithm are supplied by DR at 108. To achieve this, each Gcell received from the DR is labeled with a number. In one embodiment this number may vary from, for example, 1 to 6 depending on the severity of the DRV for that cell. A Gcell with a higher DR severity has a higher label. For example, a Gcell that has a cell density of, for example, 100 has a higher DRV severity than a Gcell with a cell density of 50. Therefore, the ML-based model receives, for each Gcell in the design, a list of features that is characteristic of the cell, and a label representative of the severity of the DRC for that cell. Accordingly, to be trained, the ML-based model is trained using the input data as well as the output data of the DR. The training and optimization of the ML-based system at 110, based on the received features and labels as described above, results in the generation of predictor model 120.

Figure 5B:
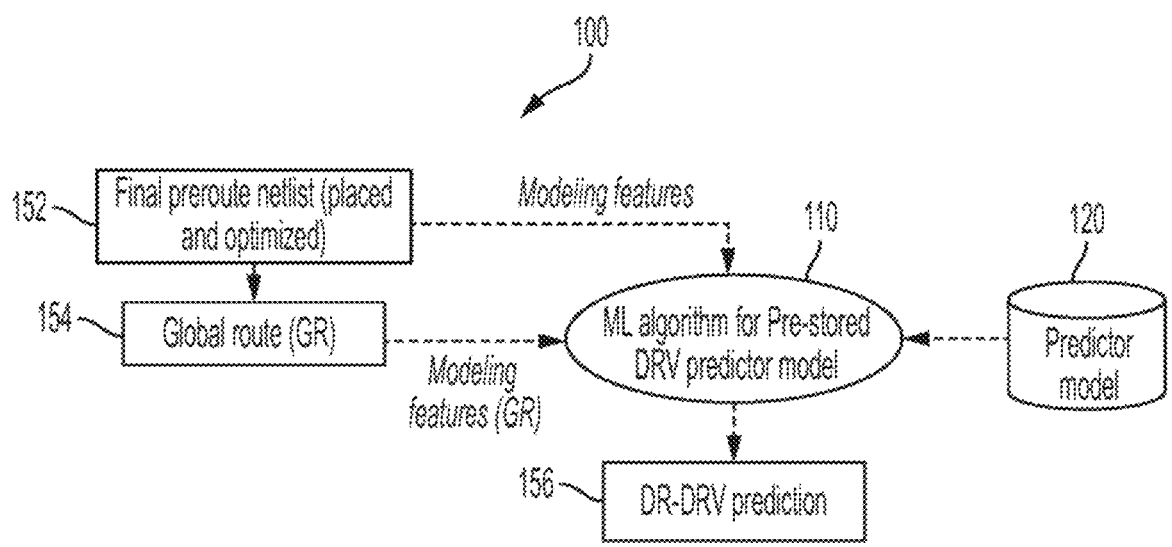
FIG. 5B is a flowchart applying a trained ML-based system to predict the number of DRVs of a design, in accordance with one embodiment of the present invention.

FIG. 5B is a flowchart 150 for using the ML-based system, trained as described above with reference to FIG. 5A, to predict the severity of the DRV for a design under development. At 152, place and route associated features (from the final pre-route netlist that is substantially placed and optimized), such as pin density, cell density, and the like, as listed above, are also supplied to the trained ML-based prediction algorithm 110 by the placement and route tool. At 154, GR associated such as GR overflow, GR demand/supply, and the number of Glink segments on GR nets that violate min area rules are provided from the GR tool to the trained ML-based system 110. The mode predictor 120, trained as described above with reference to FIG. 5A, uses the information supplied to ML-based system 110 to predict the labels for the design under consideration. The label is a number indicative of the DRV severity of the design under development.

Figure 5C:
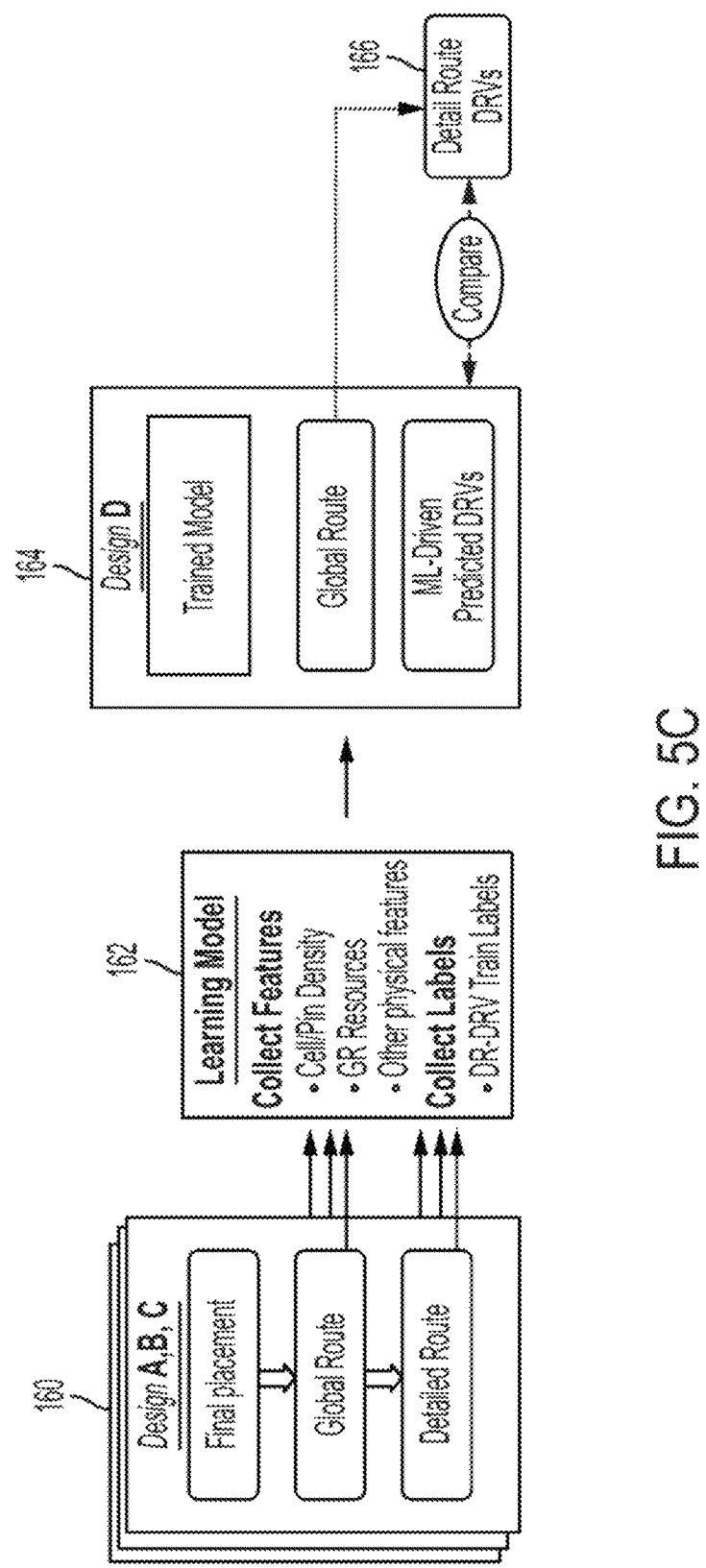
FIG. 5C shows a trained ML-based system used to predict the number of DRVs of a design, in accordance with one embodiment of the present invention.

FIG. 5C shows that three different circuit designs, namely designs A, B and C at 160 are used to train an ML-based model 162, as also described above with reference to FIG. 5A. To perform this training, features from final prerout at 102 and global route, as well training labels from DR at 108 are used. The trained ML-based system 162 is subsequently used to predict the severity of the DRV of design D at 164. The DRV data predicted for design D may be used to further optimize the ML-based training model.

Figure 6A:
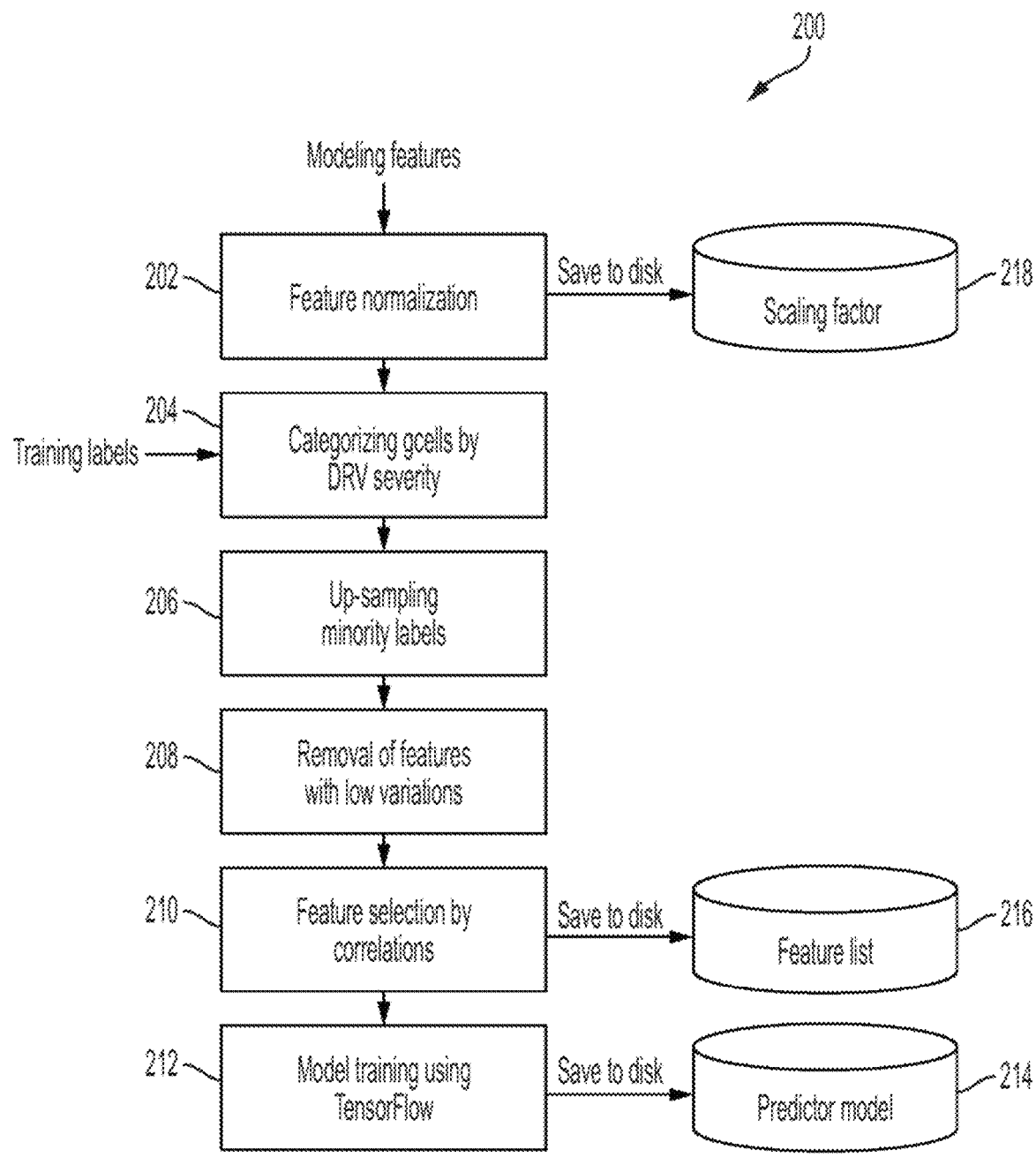
FIG. 6A is a flowchart showing a number of pre-processing operations performed during training of an M-based system, in accordance with one embodiment of the present invention.

In accordance with one aspect of the present invention, one or more pre-processing algorithms are used to improve the model accuracy. FIG. 6A is a flowchart 200 of such pre-processing and provides a more detailed description of step 110 of FIG. 5A. Modeling features received at 202 are normalized to scale each feature according to the feature's average and standard deviation. Feature normalization prevents the ML-based (e.g. TensorFlow) system's objective functions from being skewed by wide-spread features. Next, at 204, using the training labels (described above) Gcells are categorized according to their DRV severity, defined as the numbers of DRVs in a Gcell. Categorizing the Gcells provides a with finite numbers of labels and transforms the modeling from a regression problem to a classification problem. This, in turn, enables the application of different weighting to each DRV severity class so as to accurately predict Gcells with large number of DRVs. Categorizing the cell by their DRV severity also enables the integration of the ML-based model with a placement or routing tool.

Next, at 206, the minority labels are up-sampled by way of increasing the number of Gcells with minority labels. Assume, for example, that a design has of 100 Gcells, only 2 of which, namely Gcell_1 and Gcell_2 have DRVs. Because only 2% of the Gcells have DRVs, a predictive model for such a design will not be accurate. To rectify this problem, the number of Gcells with DRVs are multiplied (repeated) by a number, e.g., 10 to up-sample the labels. Therefore, the model is trained with a design that has 98 Gcells with no DRVs and 20 Gcells, 10 of which are duplicates of Gcell_1, and the other 10 of which are duplicates of Gcell_2.

Next, at 208, features that have low (e.g., near zero) variations are removed from consideration and are filtered out. For example, assume that a feature has a value of 0.5 for all Gcells. Because there is no variation for this feature across the Gcells of the design, this feature will have no impact on the model. At 210, the degree of correlation between each feature and the DRVs is used to select the features that have a relatively high correlation with the DRVs. Such correlation data is often provided by the place and route tool that performs the routings. At 212, the selected features are used to train the ML-based system (e.g., Tensorflow) to generate the predictor model. The results of feature normalization 202 are stored as scaling factor in storage 218. The features selected via correlation at 210 is stored in storage 216. The trained predictor model at 212 is stored in disc storage 214.

Figure 6B:
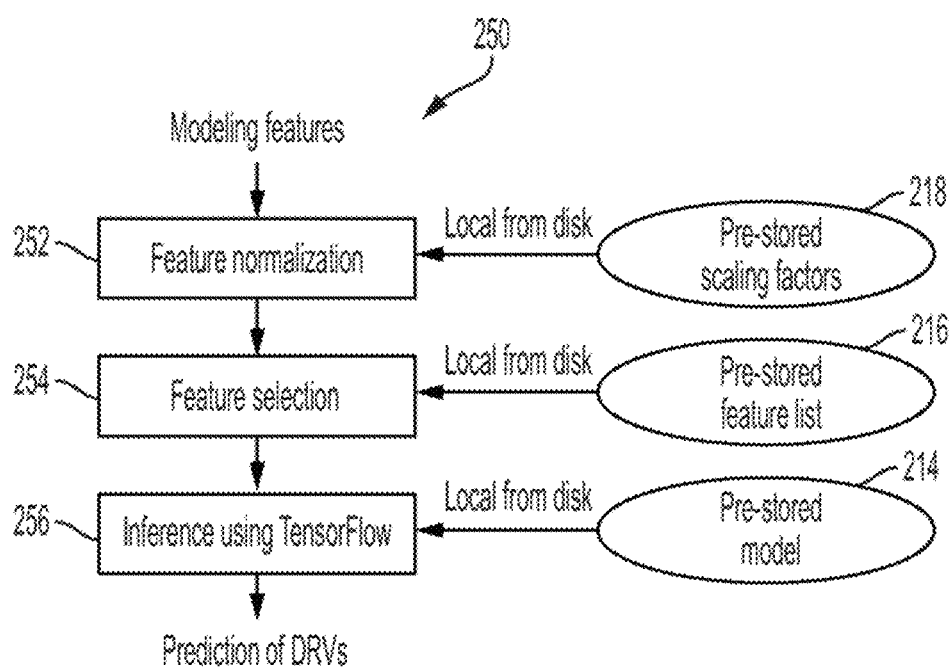
FIG. 6B is a flowchart or predicting the DRVs of a design under development using an ML-based system trained as shown in FIG. 6A, in accordance with one embodiment of the present invention.

FIG. 6B is a flowchart 250 for predicting the DRVs of a design under development using an ML-based system, trained, in part in accordance with flowchart 6A described above. To achieve this, the modeling features received at 252 are scaled using the scaling factors loaded from storage 218. Thereafter, at 254, the feature list previously stored in storage 216 are loaded and used together with the features received from 252 to enable the selection of features for model prediction. The features selected at 254 together with the model loaded from storage 214 are used during an inference cycle (that may be based e.g. on TensorFlow) to predict the DRVs at 256.

Embodiments of the present invention may be used, for example, by circuit designers, Electronic Design Automation (EDA) tool developers or debug/verification engineers to analyze the DRVs early in the flow, e.g., at placement, or placement optimization or global route. Embodiments of the present invention provide a visual aid in physically locating the DRVs, and predict their severity. Embodiments of the present invention provide placement, legalization, optimization and global routing algorithms with a more accurate prediction of DRVs by using the GR information. Embodiments of the present invention therefore can guide such algorithms to prioritize fixing of high-risk/high-density DRV hotspots.

Furthermore, embodiments of the present invention, by providing training labels during model training, are configured to predict DRVs on each of the routing metal layers, thereby enabling accurate prediction of required routing resources (demand and supply), which can assist the placement and legalization algorithms to make the final placement easier to route.

Figure 7A:
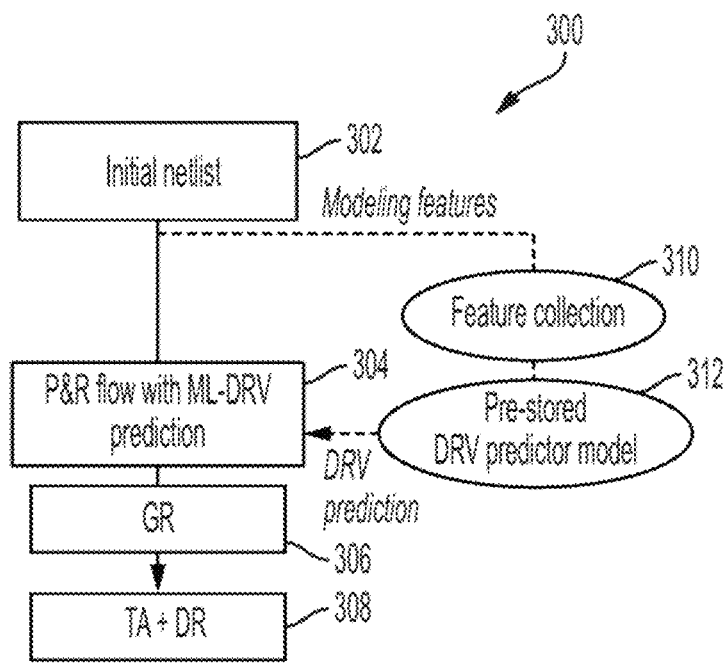
FIG. 7A is a flowchart for integrating an ML-based system into a place and route tool, in accordance with one embodiment of the present invention.

FIG. 7A is a flowchart showing how an ML-based system, in accordance with embodiments of the present invention, may be integrated into a place and route tool. The netlist received at 302 is delivered at 304 to the place & route tool that has an integrated ML-based DRV prediction capability, in accordance with embodiments of the present invention. From the netlist, the place and route associated features such as pin density, cell density, and the like, as listed above, are determined and supplied at 310 for feature collection. Next, the DRV model predictor predicts the DRVs at 312 and supplies the results to the place & route tool that uses the prediction to identify and improve regions that are difficult to route before routing, in accordance with embodiments of the present invention. The improved design then proceeds with GR, TA, and DR. The predicted DRVs are used to mitigate the DRVs.

Figure 7B:
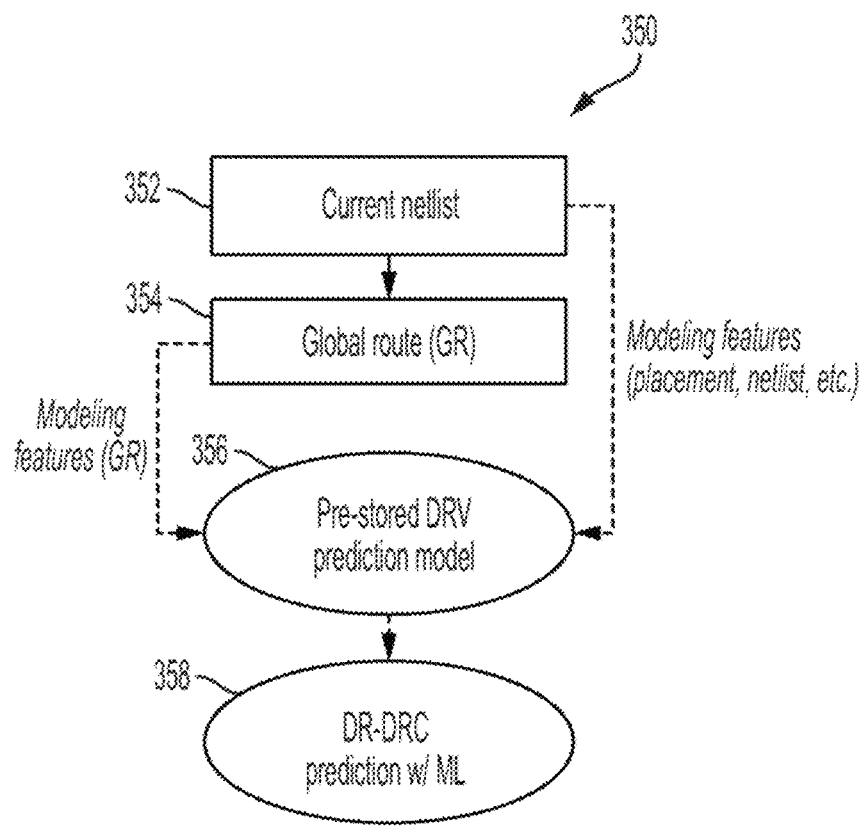
FIG. 7B is a flowchart for an ML-based system configured to help a user visually in identifying physical locations of the DRVs, in accordance with one embodiment of the present invention.

Embodiments of the present invention may be used as a standalone analysis tool. FIG. 7B shows how embodiments of the present invention may help a user visually, e.g. by way of a heat map, in identifying physical locations of the DRVs. In such embodiments, from a netlist at 352, place and route associated features such as pin density, cell density, and the like, as listed above, are supplied to the trained ML-based model at 356. The netlist from 352 is used by the GR at 354 to obtain and deliver further GR associated features such as GR overflow, GR demand/supply, and the number of Glink segments on GR nets that violate min area rules are supplied to the trained ML-based model at 356. Using such features, the ML-based system predicts at 358 the DRVs in a human readable form, such as a heatmap identifying regions in the layout that are difficult to route.

Figure 7C:
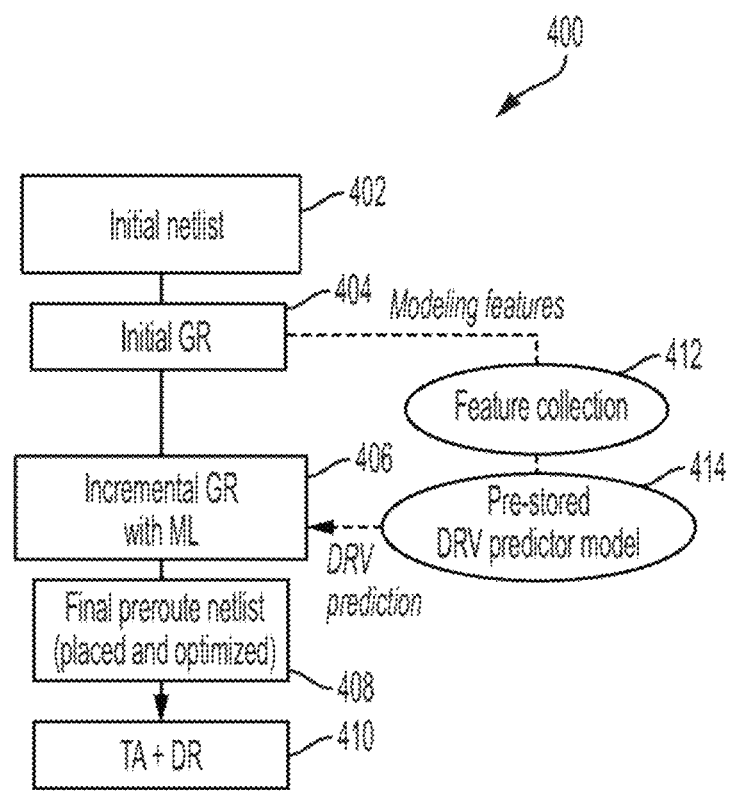
FIG. 7C is a flowchart showing how an ML-based system may be used to incrementally improve GR correlation, in accordance with one embodiment of the present invention.

FIG. 7C is a flowchart 400 showing how embodiments of the present invention may be used to incrementally improve GR correlation. The netlist at 402 is used to perform an initial GR at 404. From the GR at 404, place and route associated features, as well as GR associated features are determined and supplied for feature collection at 412 and DRV prediction at 414 using an ML-based system, in accordance with embodiments of the present invention. The predicted DRVs together with the initial GR are used to incrementally improve the GR at 406. The improved GR may then be used by a placement optimization tool as shown at 408, and a DR engine as shown at 410 to apply different routability improvement algorithms (e.g., cell spreading, smarter metal layer selection, DRV-aware buffer insertion, logic reconstruction) to achieve better results.

Embodiments of the present invention may be used to optimize the cell expansion factor by performing multiple DRV predictions each associated with a different cell expansion factor. To achieve this, new feature values are derived from different cell expansion factors, (e.g., cell density is inversely proportional to cell expansion). The derived feature values after expansion are then fed into the ML-based system of the present invention to estimate the DRV severity. The expansion (or shrinkage) factors may then be changed repeatedly until the model predicts acceptable DRV severity, e.g., by meeting a threshold value. The minimum cell expansion factor that can provide acceptable DRV severity in coarse placement is then achieved.

Figure 8A:
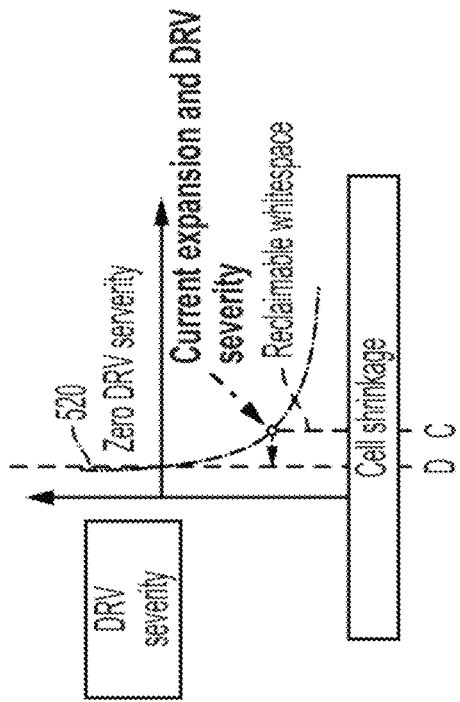
FIG. 8A shows an exemplary plot of DRV severity as a function of cell expansion factor, obtained using an ML-based system in accordance with one embodiment of the present invention.

FIG. 8A shows an exemplary plot 510 of DRV severity as a function of cell expansion factor, obtained using embodiments of the present invention. The plot shows that to achieve the acceptable level of severity at point A, the cell expansion factor needs to be increased from B1 to B2. FIG.

8B shows an exemplary plot 520 of DRV severity as a function of cell shrinkage factor, obtained using embodiments of the present invention. Plot 520 shows that the cell may be pulled together by a factor represented by the shrinkage from point C to point D while meeting the DRV requirement. Embodiments of the present invention, as described above may also be combined with other performance metrics, such as timing, to guide the placer during cell spreading.

Embodiments of the present invention provide significant advantages when used, for example, in physical design tools by overcoming the key challenge of DR-DRV closure at advanced nodes, while avoiding the significant runtime overhead of repeatedly running full DR to estimate DRVs. The early and accurate feedback provided by embodiments of the present invention enable users to make changes early so as to avoid expensive design cycles.

Embodiments of the present invention substantially improve the accuracy of overflow heatmaps provided by GR as shown in Table I below As described above, embodiment of the present invention predict DRVs that are summed across all routing metal layers. Each row in Table 1 shows the accuracy and F1 score, described further below, of multiple layouts on which a model was tested. The tests were conducted on design datasets some of which were used during the training (also referred to herein as layouts that were seen) while others were not used during the training (also referred to herein as layouts that were not seen). For layouts that are seen in training (Layout1, Layout3, Layout4, Layout5, and Layout6), all the Gcells were used for training and rerunning the prediction on the Gcells. For unseen layouts (Layout2 and Layout7), all Gcells were used for testing and report metrics in Table I.

TABLE I

| | GR Overflow | | ML | |
| --- | --- | --- | --- | --- |
| | Acc | F1 | Acc | F1 |
| Layout1 | 1% | 0.02 | 98% | 0.99 |
| Layout2 | 5% | 0.08 | 31% | 0.40 |
| Layout3 | 3% | 0.06 | 99% | 0.99 |
| Layout4 | 2% | 0.05 | 99% | 0.99 |
| Layout5 | 3% | 0.05 | 98% | 0.99 |
| Layout6 | 4% | 0.07 | 99% | 0.99 |
| Layout7 | 2% | 0.03 | 40% | 0.51 |

Significant improvements in DRV prediction accuracy are obtained for both seen and unseen layouts. For example, in Layout1, GR overflow has an accuracy (Acc) of only 1%, whereas a model, in accordance with embodiments of the present invention, provides an accuracy of 98% in predicting DRVs. For an unseen layout, such as Layout7, GR overflow has an accuracy of 2%, whereas a model, in accordance with embodiments of the present invention, provides an accuracy of 40%.

In Table 1, F1 scores represent the harmonic averages of precision, which is a metric for true positives, and recall which is a metric for false positives. The term Precision is defined as the ratio of the accurately predicted DRVs to all predictions both accurate and inaccurate ones. This metric is representative of the ability of the ML-based model to accurately predict the relevant and actual DRVs to all predictions that the model considered as relevant. The term Recall is defined the ratio of the actually predicted DRVs to the sum of actually predicted DRVs and DRVs that the model fails to predict. This metric is representative of the ability of ML-based model to accurately predict only the relevant and actual DRVs in the design.

Figure 9A:
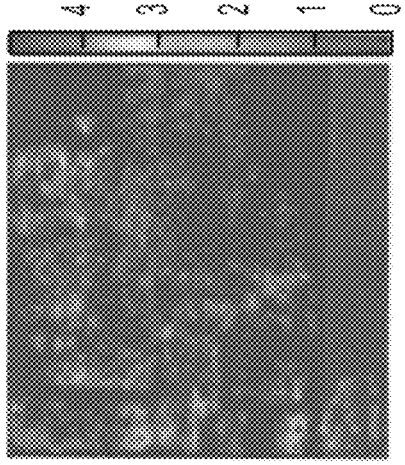
FIG. 9A shows the heat map associated with golden DRVs of a design layout.
Figure 9B:
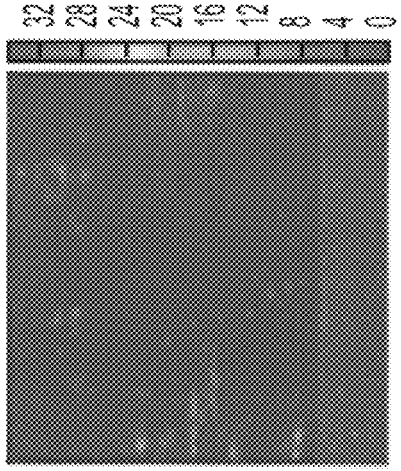
FIG. 9B show the heat map generated by the GR overflow for the design layout of FIG. 9A.
Figure 9C:
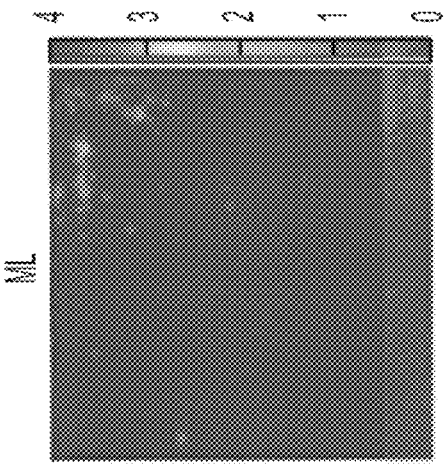
FIG. 9C show the heat map generated by an ML-based system for the design layout of FIG. 9A, in accordance with embodiments of the present invention.

FIG. 9A shows the heat map associated with golden DRVs (known to be correct), of a design associated with Layout1 of table 1. FIGS. 9B and 9C respectively show the heat map generated by the GR overflow, and an ML-based system trained in accordance with embodiments of the present invention. As is seen, the ML predicted DRV of FIG. 9C provides substantial improvement over to the GR overflow of FIG. 9B, and is substantially similar to the golden heat map of 9A.

Figure 10A:
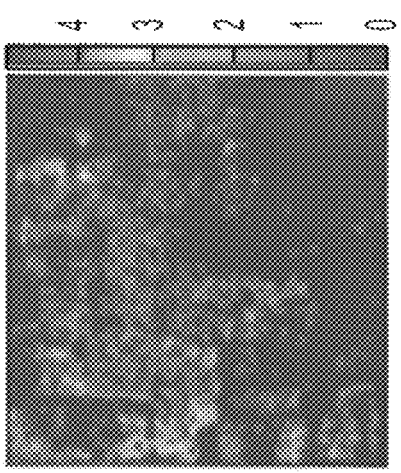
FIG. 10A shows the heat map associated with golden DRVs of another design layout.
Figure 10B:
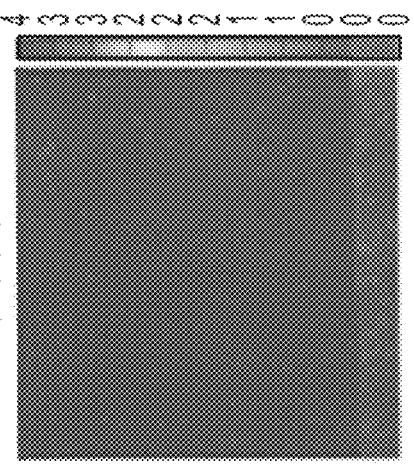
FIG. 10B show the heat map generated by the GR overflow for the design layout of FIG. 10A.
Figure 10C:
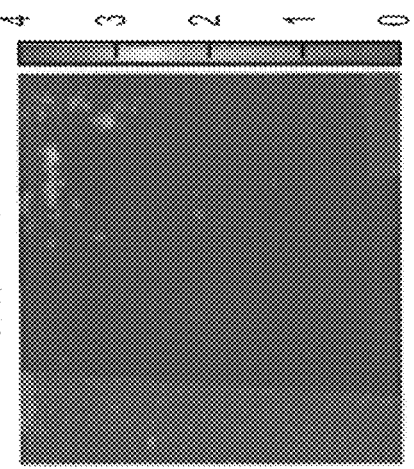
FIG. 10C show the heat map generated by an ML-based system for the design layout of FIG. 10A, in accordance with embodiments of the present invention.

FIG. 10A shows the heat map associated with golden DRVs (known to be correct), of a design associated with Layout2 of table 1. FIGS. 10B and 10C respectively show the heat map generated by the GR overflow, and an ML-based system trained in accordance with embodiments of the present invention. As is seen, the ML predicted DRV of FIG. 10C provides substantial improvement over to the GR overflow of FIG. 10B, and is substantially similar to the golden heat map of 10A.

Figure 11A:
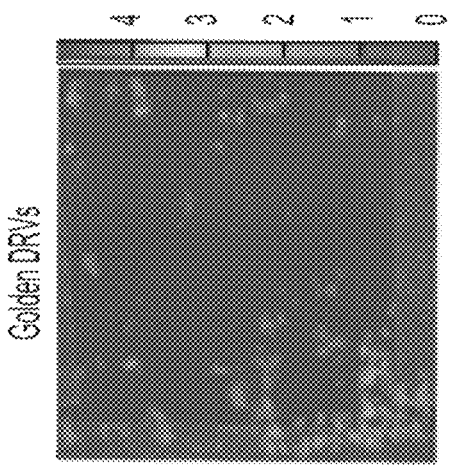
FIG. 11A shows the heat map associated with golden DRVs of another design layout.
Figure 11B:
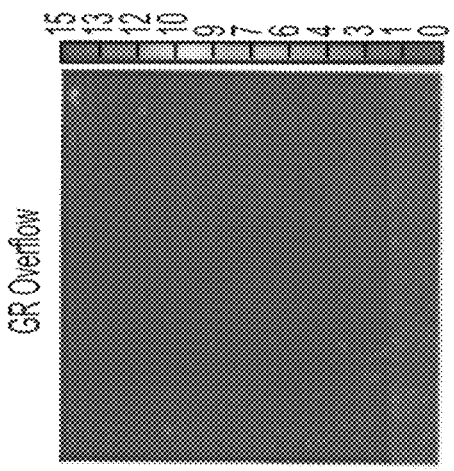
FIG. 11B show the heat map generated by the GR overflow for the design layout of FIG. 11A.
Figure 11C:
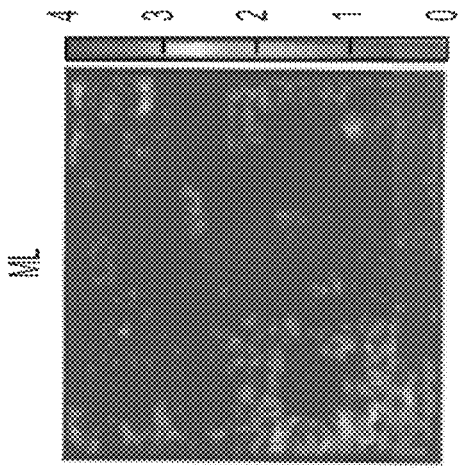
FIG. 11C show the heat map generated by an ML-based system for the design layout of FIG. 11A, in accordance with embodiments of the present invention.

FIG. 11A shows the heat map associated with golden DRVs (known to be correct), of a design associated with Layout7 of table 1. FIGS. 11B and 11C respectively show the heat map generated by the GR overflow, and an ML-based system trained in accordance with embodiments of the present invention. As is seen, the ML predicted DRV of FIG. 11C provides substantial improvement over the GR overflow of FIG. 11B, and is substantially similar to the golden heat map of 11A.

In addition to accurately predicting DRVs early in the design cycle, embodiments of the present invention significantly reduce the runtime in predicting the DRVs. Table II show the significant runtime benefits that a DRV prediction model, in accordance with embodiment of the present invention, achieve. Columns 1 and 2 of Table II identify the design name and corresponding layout name of seven different designs. The layouts used in Table II are the same as those used in Table I above. Columns 3 and 4 of Table II respectively show the number of DRVs and Gcell of the layout associated with that design. The column labeled "TA+DR" runtime shows the runtime incurred by running full detail route. The runtime in column labeled "ML runtime" shows the runtimes obtained in DRV prediction using embodiments of the present invention. As is seen from Table II, substantial improvement in speed (>~2500×) is obtained by using embodiments of the preset invention.

TABLE II

| Design master | Layout name | #DRV Gcell | #all Gcell | TA + DR runtime | ML runtime (training / inferencing) |
| --- | --- | --- | --- | --- | --- |
| Design1 | Layout1 | 152 | 11881 | 7 hr | <10 sec |
| Design2 | Layout2 | 7166 | 25281 | 37 hr | <10 sec |
| Design2 | Layout3 | 1705 | 25440 | 13 hr | <10 sec |
| Design1 | Layout4 | 1836 | 10920 | 28 hr | <10 sec |
| Design2 | Layout5 | 4420 | 24649 | 24 hr | <10 sec |
| Design1 | Layout6 | 1854 | 10404 | 23 hr | <10 sec |
| Design1 | Layout7 | 736 | 10404 | 16 hr | <10 sec |

DETAILED DESCRIPTION— TECHNOLOGY SUPPORT

General Computer Explanation

FIGS. 12A, 12B and 12C are simplified block diagrams of a computer system suitable for use with embodiments of the technology, as well as circuit design and circuit embodiments of the technology.

In FIG. 12A, computer system 3110 typically includes at least one computer or processor 3114 which communicates with a number of peripheral devices via bus subsystem 3112. Typically, the computer can include, or the processor can be, any of a microprocessor, graphics processing unit, or digital signal processor, and their electronic processing equivalents, such as an Application Specific Integrated Circuit (ASIC) or Field Programmable Gate Array (FPGA). The terms 'processor' and 'computer' are further defined below. These peripheral devices may include a storage subsystem 3124, comprising a memory subsystem 3126 and a file storage subsystem 3128, user interface input devices 3122, user interface output devices 3120, and a network interface subsystem 3116. The input and output devices allow user interaction with computer system 3110.

The computer system may be a server computer, a client computer, a workstation, a mainframe, a personal computer (PC), a tablet PC, a set-top box (STB), a personal digital assistant (PDA), a cellular telephone, a smartphone, a web appliance, a rack-mounted "blade", a kiosk, a television, a game station, a network router, switch or bridge, or any data processing machine capable of executing instructions 124 (sequential or otherwise) that specify actions to be taken by that machine.

The computer system typically includes an operating system, such as Microsoft's Windows, Sun Microsystems's Solaris, Apple Computer's MacOs, Linux or Unix. The computer system also typically can include a Basic Input/Output System (BIOS) and processor firmware. The operating system, BIOS and firmware are used by the processor to control subsystems and interfaces connected to the processor. Typical processors compatible with these operating systems include the Pentium and Itanium from Intel, the Opteron and Athlon from Advanced Micro Devices, and the ARM processor from ARM Holdings.

Innovations, embodiments and/or examples of the claimed inventions are neither limited to conventional computer applications nor the programmable apparatus that run them. For example, the innovations, embodiments and/or examples of what is claimed can include an optical computer, quantum computer, analog computer, or the like. The computer system may be a multi-processor or multi-core system and may use or be implemented in a distributed or remote system. The term 'processor' here is used in the broadest sense to include a singular processor and multi-core or multi-processor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions 124 to perform any one or more of the sets of instructions discussed herein. Due to the ever-changing nature of computers and networks, the description of computer system 3110 depicted in FIG. 12A is intended only as one example for purposes of illustrating the preferred embodiments. Many other configurations of computer system 3110 are possible having more or less components than the computer system depicted in FIG. 12A.

Network interface subsystem 3116 provides an interface to outside networks, including an interface to communication network 3118, and is coupled via communication network 3118 to corresponding interface devices in other computer systems or machines. Communication network 3118 may comprise many interconnected computer systems, machines and communication links. These communication links may be wireline links, optical links, wireless links, or any other devices for communication of information. Communication network 3118 can be any suitable computer network, for example a wide area network such as the Internet, and/or a local area network such as Ethernet. The communication network can be wired and/or wireless, and the communication network can use encryption and decryption methods, such as is available with a virtual private network. The communication network uses one or more communications interfaces, which can receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. One or more communications protocols can be used, such as HTTP, TCP/IP, RTP/RTSP, IPX and/or UDP.

User interface input devices 3122 may include an alphanumeric keyboard, a keypad, pointing devices such as a mouse, trackball, touchpad, stylus, or graphics tablet, a scanner, a touchscreen incorporated into the display, audio input devices such as voice recognition systems or microphones, eye-gaze recognition, brainwave pattern recognition, and other types of input devices. Such devices can be connected by wire or wirelessly to a computer system. In general, use of the term "input device" is intended to include all possible types of devices and ways to input information into computer system 3110 or onto communication network 3118. User interface input devices typically allow a user to select objects, icons, text and the like that appear on some types of user interface output devices, for example, a display subsystem.

User interface output devices 3120 may include a display subsystem, a printer, a fax machine, or non-visual displays such as audio output devices. The display subsystem may include a cathode ray tube (CRT), a flat-panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term "output device" is intended to include all possible types of devices and ways to output information from computer system 3110 to the user or to another machine or computer system.

Memory subsystem 3126 typically includes a number of memories including a main random-access memory (RAM) 3130 (or other volatile storage device) for storage of instructions and data during program execution and a read only memory (ROM) 3132 in which fixed instructions are stored. File storage subsystem 3128 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 3128.

Bus subsystem 3112 provides a device for letting the various components and subsystems of computer system 3110 communicate with each other as intended. Although bus subsystem 3112 is shown schematically as a single bus, alternative embodiments of the bus subsystem may use multiple busses. For example, RAM-based main memory can communicate directly with file storage systems using Direct Memory Access (DMA) systems.

FIG. 12B depicts a memory 3140 such as a non-transitory, computer readable data and information storage medium associated with file storage subsystem 3128, and/or with network interface subsystem 3116, and can include a data structure specifying a circuit design. The memory 3140 can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light).

FIG. 12C signifies an integrated circuit 3190 created with the described technology that includes one or more cells selected, for example, from a cell library.

DETAILED DESCRIPTION—TECHNOLOGY SUPPORT

Hardware/Software Equivalence

Some of the innovations, embodiments and/or examples described herein comprise and/or use a processor. As used herein, the term 'processor' signifies a tangible data and information processing device that physically transforms data and information, typically using a sequence transformations (also referred to as 'operations'). Data and information can be physically represented by an electrical, magnetic, optical or acoustical signal that is capable of being stored, accessed, transferred, combined, compared, or otherwise manipulated by the processor. The term "processor" can signify a singular processor and multi-core systems or multi-processor arrays, including graphic processing units, digital signal processors, digital processors or combinations of these elements.

The processor can be electronic, for example, comprising digital logic circuitry (for example, binary logic), or analog (for example, an operational amplifier). The processor can also be non-electronic, for example, as seen in processors based on optical signal processing, DNA transformations or quantum mechanics, or a combination of technologies, such as an optoelectronic processor. For data and information structured in binary form, any processor that can transform the data and information using the AND, OR and NOT logical operations (and their derivatives, such as the NAND, NOR, and XOR operations) can transform the data and information using any function of Boolean logic. A processor such as an analog neural network processor can also transform data and information non-digitally. There is no scientific evidence that any of these processors are processing, storing and retrieving data and information, in any manner or form equivalent to the bioelectric structure of the human brain.

The one or more processors may also operate to support performance of the relevant operations in a 'cloud computing' environment or as a 'software as a service' (SaaS). For example, at least some of the operations may be performed by a group of processors available at a distributed or remote system, these processors accessible via a communications network (e.g., the Internet) and via one or more software interfaces (e.g., an application program interface (API).)

As used herein, the term 'module' signifies a tangible data and information processing device, that typically is limited in size and/or complexity. For example, the term 'module' can signify one or more methods or procedures that can transform data and information. The term 'module' can also signify a combination of one or more methods and procedures in a computer program. The term 'module' can also signify a small network of digital logic devices, in which interconnections of the logic devices give structure to the network. Methods and procedures comprising a module, specified in a specialized language, such as System C, can be used to generate a specification for a network of digital logic devices that process data and information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs—for example, sold by Xilink or Intel's Altera), Random Access Memories (RAMs) or microprocessors. A module is configured to process data and information, typically using a sequence transformations (also referred to as 'operations') applied to the data and information (or in the case of ROMs and RAMS, transforming data and information by using the input information as an address for memory that stores output data and information), to perform aspects of the present innovations, embodiments and/or examples of the invention.

Modules that are temporarily configured need not be configured at any one instance in time. For example, a processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The "substance" of a module's processing is independent of the form in which it is manufactured or implemented.

As used herein, the term 'algorithm' signifies a process comprising a sequence or set of operations or instructions that a module can use to transform data and information to achieve a result. A module can comprise one or more algorithms. As used herein, the term 'thread' refers to a sequence of instructions that can comprise a subset of the instructions of an entire process or algorithm. A process or algorithm can be partitioned into multiple threads that can be executed in parallel.

As used herein, the term 'computer' includes at least one information processor that, for example, can perform certain operations such as (but not limited to) the AND, OR and NOT logical operations using electronic gates that can comprise transistors, with the addition of memory (for example, memory based on flip-flops using the NOT-AND or NOT-OR operation). Such a processor is said to be Turing-complete or computationally universal. A computer, whether or not it is a digital computer, typically comprises many modules.

As used herein, the term 'software' or 'program' signifies one or more algorithms and data structures that configure a processor for use in the innovations, embodiments and examples described in this specification. Such devices configurable by software include one or more computers, for example, standalone, client or server computers, or one or more hardware modules, or systems of one or more such computers or modules. As used herein, the term "software application" signifies a set of data and instructions that configure the processor to achieve a specific result, for example, to perform word processing operations, or to encrypt a set of data.

As used herein, the term 'programming language' signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the "C" programming language or similar programming languages (such as SystemC), or object oriented programming language such as Smalltalk, C++ or the like, and any future equivalent programming languages.

Software is entered into, equivalently, read into, one or memories of the computer or computer system from a data and information storage device. The computer typically has a device for reading storage media that is used to transport the software or has an interface device that receives the software over a network. This process is discussed in the General Computer Explanation section.

DETAILED DESCRIPTION—TECHNOLOGY SUPPORT

EDA System/Workflow Explanation

Figure 13:
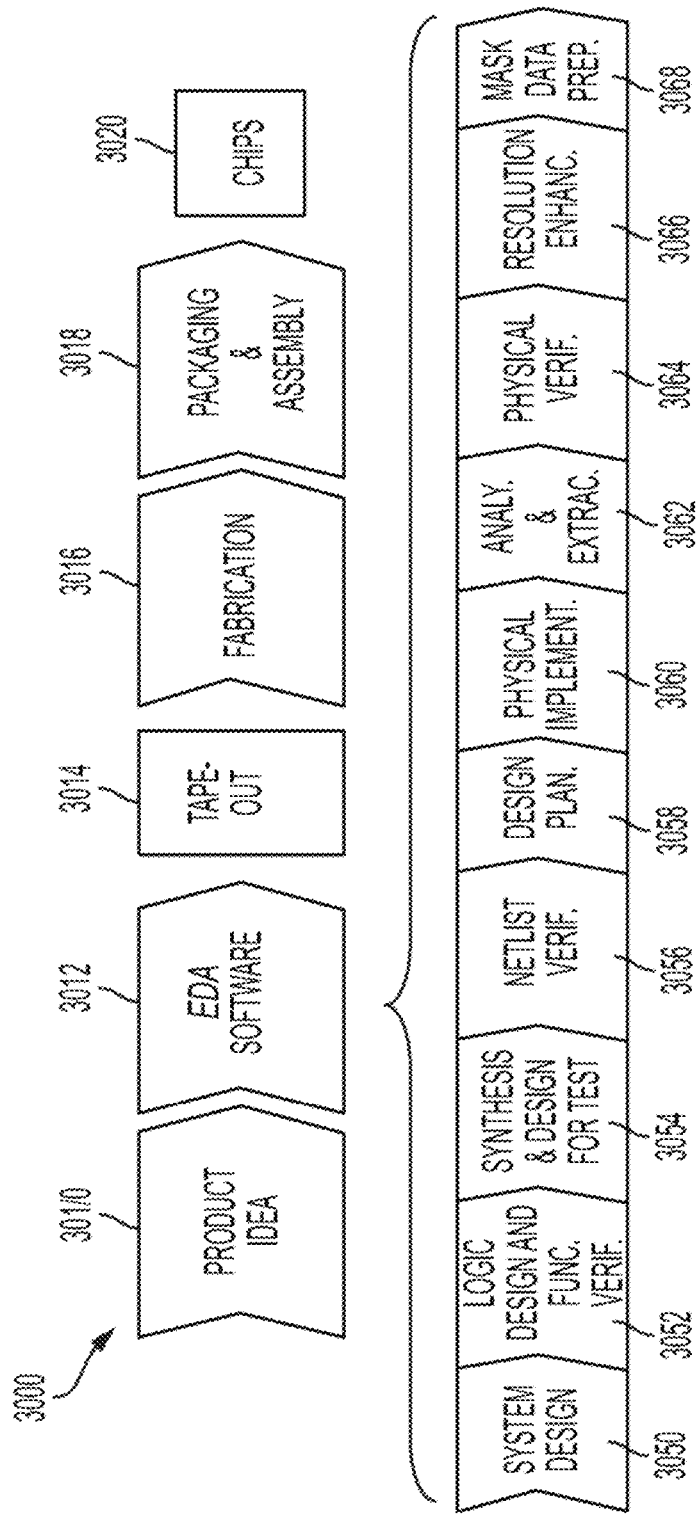
FIG. 13 shows various processes performed in the design, verification and fabrication of an integrated circuit design.

FIG. 13 illustrates various processes performed in the design, verification and fabrication of an item of manufacture such as an integrated circuit using software tools with a computer, and possibly special hardware-assisted tools, to transform and verify design data and instructions that represent the integrated circuit. These processes start with the generation of a product idea 3010 with information supplied by a designer, information which is transformed during a process to create an item of manufacture (referred to herein as a design or device) that uses an EDA software tool 3012, which may also be signified herein as EDA software, as a design tool, or a verification tool. When the design is finalized, it can be taped-out 3034, which typically is when artwork (e.g., geometric patterns) for the integrated circuit is sent to a fabrication facility to manufacture the mask set, which is then used to manufacture the integrated circuit. After tape-out, a semiconductor die is fabricated 3036 and packaging and assembly processes 3018 are performed, which result in the finished integrated circuit 3020 which may also be signified herein as a circuit, device, component, chip or SoC (System on Chip).

Items of manufacture, for example, a circuit or system are used in commerce at a variety of levels of abstraction ranging from low-level transistor layouts to high-level description languages. Most designers start at high-level of abstraction to design their circuits and systems, using a hardware description language (HDL) such as VHDL, Verilog, SystemVerilog, SystemC, MyHDL or OpenVera. The high-level HDL is easier for developers to comprehend, especially for a vast system, and may describe highly complex concepts that are difficult to grasp using a lower level of abstraction. The HDL description may be converted into other levels of abstraction as is helpful to the developers. For example, a high-level description may be converted to a logic-level register transfer level (RTL) description, a gate-level (GL) description, a layout-level description, or a mask-level description. Each lower abstraction level introduces more detail into the design description. The lower-levels of abstraction may be generated automatically by computer, derived from a design library, or created by another design automation technique. An example of a specification language at a lower level of abstraction is SPICE, much used detailed descriptions of analog-based circuits.

A design process that uses an EDA software tool 3012 includes processes 3050-3068, which are described below. This design flow description is for illustration purposes only and is not meant to limit the present disclosure. For example, an actual integrated circuit design may require a designer to perform the design operations in a different sequence than the sequence described herein.

During system design 3050, a designer describes the functionality to be manufactured. The designer can also perform what-if planning to refine the functionality and to check costs, etc. Hardware-software architecture partitioning can occur at this stage. Exemplary EDA software products from Synopsys, Inc. of Mountain View, Calif., that can be used at this stage include: Model Architect, Saber, System Studio, and Designware products.

During logic design and functional verification 3052, modules in the circuit are specified in one or more hardware description languages, or HDLs, and the design in HDL is checked for functional accuracy, that is, to match the requirements of the specification of the circuit or system being designed to ensure that the design produces the correct outputs. Exemplary HDL languages are Verilog, VHDL and SystemC. Functional verification is typically done by using software-based simulators and other tools such as testbench generators, static HDL checking tools and formal verification tools. In some situations, special hardware referred to as 'emulators' or 'prototyping systems' are used to speed up the functional verification. Exemplary EDA software products from Synopsys, Inc. of Mountain View, Calif. that can be used at this stage include: VCS, Vera, Designware, Magellan, Formality, ESP and Leda products. Exemplary emulator and prototyping products also available from Synopsys that can be used at this state include: Zebu® and Protolink® (RTM="Registered Trademark").

During synthesis and design for test 3054, HDL code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products.

During netlist verification 3056, the netlist is checked for compliance with timing constraints and for correspondence with the HDL code. Exemplary EDA software products from Synopsys, Inc. of Mountain View, Calif. that can be used at this stage include: Formality, Primetime, and VCS products.

During design planning 3058, an overall floor plan for the integrated circuit is constructed and analyzed for timing and top-level routing. Exemplary EDA software products from Synopsys, Inc. of Mountain View, Calif. that can be used at this stage include: Astro and IC Compiler products.

During layout implementation 3060, the physical placement (positioning of circuit elements such as transistors or capacitors) and routing (connection of the same by a plurality of conductors) occurs, as can selection of library cells to perform specific logic functions. Exemplary EDA software products from Synopsys, Inc. of Mountain View, Calif. that can be used at this stage include: the Astro and IC Compiler products.

During analysis and extraction 3062, the circuit function is verified at the layout level, which permits refinement of the layout design. Exemplary EDA software products from Synopsys, Inc. of Mountain View, Calif. that can be used at this stage include: Astrorail, Primerail, Primetime, and Star RC/XT products.

During physical verification 3064, the layout design is checked to ensure correctness for manufacturing constraints such as DRC constraints, electrical constraints, lithographic constraints, and circuitry function matching the HDL design specification. Exemplary EDA software products from Synopsys, Inc. of Mountain View, Calif. that can be used at this stage include the Hercules product.

During resolution enhancement 3066, geometric manipulations of the layout are performed to improve manufacturability of the design. Exemplary EDA software products from Synopsys, Inc. of Mountain View, Calif. that can be used at this stage include: Proteus products.

During tape-out, data is created to be used (after lithographic enhancements are applied if appropriate) for production of lithography masks. Example EDA software products from Synopsys, Inc., that can be used during tape-out include the IC Compiler and Custom Designer families of products.

During mask-data preparation 3068, the 'tape-out' data is used to produce lithography masks that are used to produce finished integrated circuits. Exemplary EDA software products from Synopsys, Inc. of Mountain View, Calif. that can be used at this stage include the CATS family of products.

For all of the above mentioned integrated circuit design tools, similar tools from other EDA vendors, such as Cadence, Siemens, other corporate entities or various non-commercial tools from universities, or open source repositories, can be used as an alternative.

Embodiments of the present disclosure can be used during one or more of the above-described stages. Specifically, some embodiments of the present disclosure can be used in EDA software 3012.

A storage subsystem is preferably used to store the programs and data structures that provide the functionality of some or all of the EDA tools described herein, and tools applied for development of cells for the library and for physical and logical design using the library. These programs and data structures are generally executed by one or more processors in a manner known to those of ordinary skill in the art.

DETAILED DESCRIPTION— TECHNOLOGY SUPPORT

Emulation Environment Explanation

Figure 14:
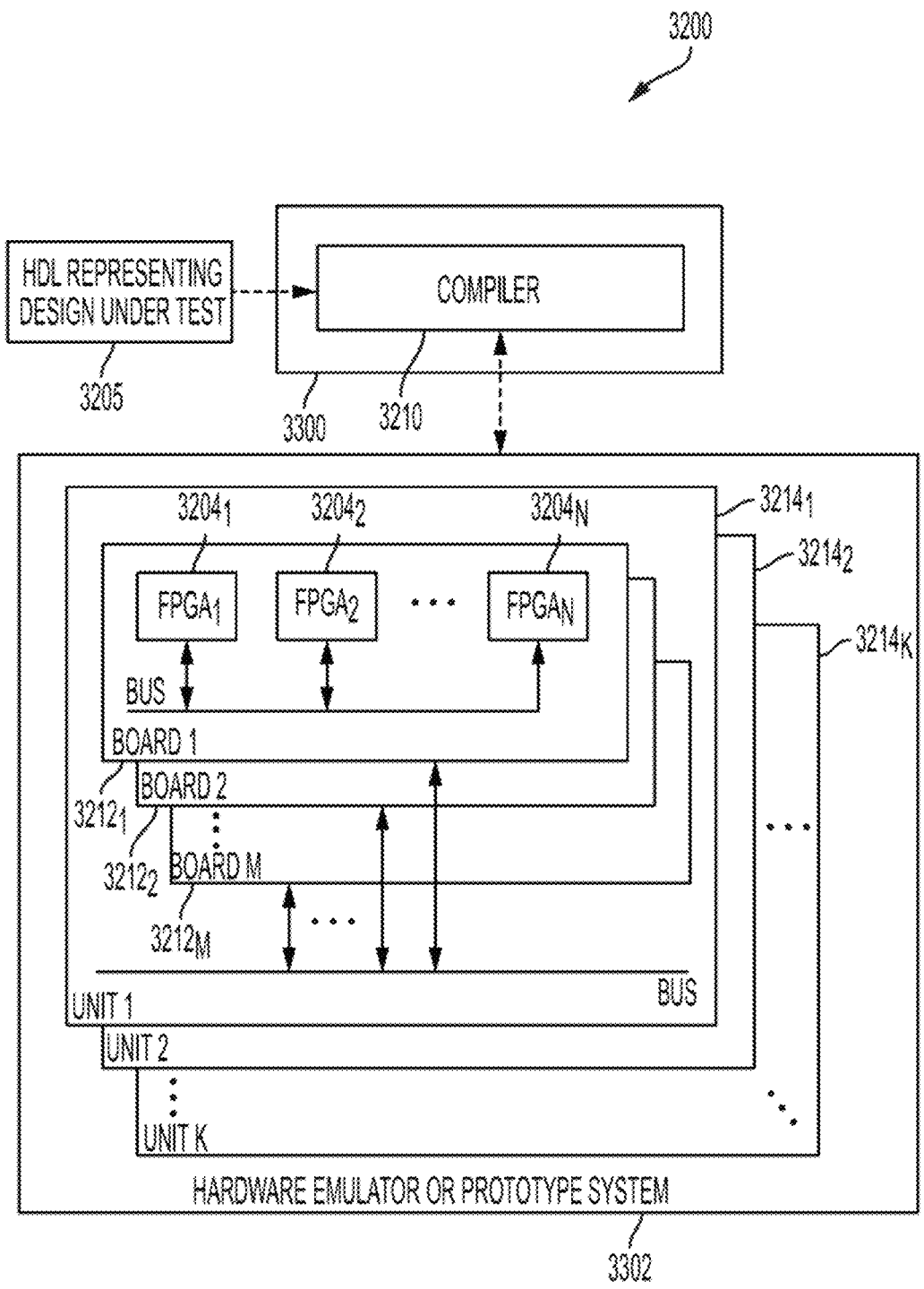
FIG. 14 shows components of an emulation system.

An EDA software system, such as element 3012 depicted in FIG. 13, typically includes an emulation system 3054 to verify the functionality of the circuit design. FIG. 14 depicts a typical emulation system which includes a host computer system 3300 (often part of an EDA system) and an emulator system 3202 (typically a set of programmable devices such as Field Programmable Gate Arrays (FPGAs)). The host system generates data and information, typically using a compiler 3210, to configure the emulator to emulate a circuit design. One of more circuit designs to be emulated are referred to as a DUT (Design Under Test). The emulator is a hardware system that emulates a DUT, for example, to use the emulation results for verifying the functionality of the DUT. One example of an emulation system that can be used for the embodiments disclosed herein is the ZeBu Server available from Synopsys, Inc.

The host system 3300 comprises one or more processors. In the embodiment where the host system is comprised of multiple processors, the functions described herein as being performed by the host system may be distributed among the multiple processors.

The host system 3300 typically includes a compiler 3210 that processes code written in a hardware description language that represents a DUT, producing data (typically binary) and information that is used to configure the emulation system 3202 to emulate the DUT. The compiler 3210 may transform, change, reconfigure, add new functions to, and/or control the timing of the DUT.

The host system and emulator exchange data and information using signals carried by an emulation connection. The connection can be one or more electrical cables, for example, cables with pin configurations compatible with the RS232 or USB protocols. The connection can be a wired communication medium or network, such as a local area network, or a wide area network such as the Internet. The connection can be a wireless communication medium or a network with one or more points of access, using a wireless protocol such as Bluetooth® or IEEE 802.11. The host system and emulator can exchange data and information through a third device, such as a network server.

Figure 8B:
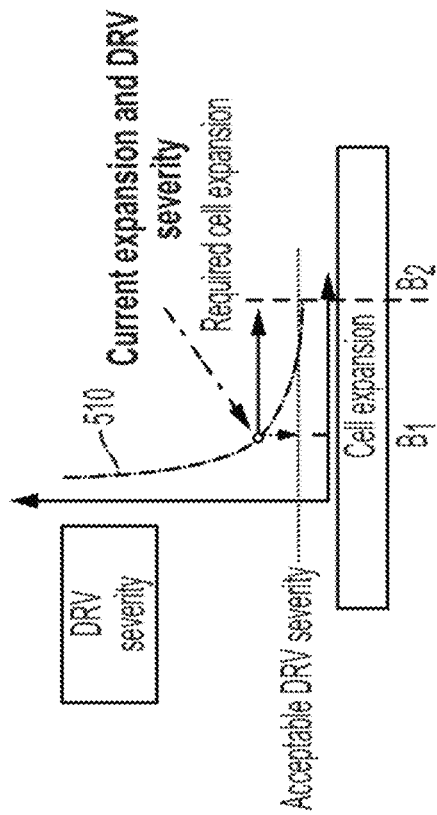
FIG. 8B shows an exemplary plot of DRV severity as a function of cell shrinkage factor, obtained using an ML-based system in accordance with one embodiment of the present invention.

The emulator includes multiple FPGAs (or other programmable devices), for example, elements $3204_1$ to $304_N$ in FIG. 8. Each FPGA can include one or more FPGA interfaces through which the FPGA is connected to other FPGAs of the emulator (and potentially other emulator hardware components), in order for the FPGAs to exchange signals. An FPGA interface may also be referred to as an input/output pin or an FPGA pad. While some embodiments disclosed herein make use of emulators comprising FPGAs, other embodiments can include other types of logic blocks instead of, or along with, the FPGAs for emulating DUTs, for example, custom FPGAs, specialized ASICs for emulation or prototyping, memories, and input/output devices.

A programmable device may include an array of programmable logic blocks and a hierarchy of reconfigurable interconnects that allow the programmable logic blocks to be connected to each other according to the descriptions in the HDL code. Each of the programmable logic blocks can be configured to perform complex combinational functions, or merely simple logic gates, such as AND, and XOR logic blocks.

In many FPGAs, logic blocks also include memory elements, which may be simple latches, flip-flops or more complex blocks of memory. Depending on the length of the interconnections between different logic blocks, signals may arrive at input terminals of the logic blocks at different times.

Programmable processors $3204_1$-$3204_N$ may be placed into one or more hardware boards 32121 through $3212_M$. Many of such boards may be placed into a hardware unit, e.g. $3214_1$. The boards within a unit may be connected using the backplane of the unit or any other types of connections. In addition, multiple hardware units (e.g., $3214_1$ through $3214_K$) may be connected to each other by cables or any other means to form a multi-unit system. In general, the hardware emulation or prototype system 3202 may be formed using a single board, a single unit with multiple boards, or with multiple units without departing from the teachings of the present disclosure.

For a DUT that is to be emulated, the emulator receives from the host system one or more bit files including a description of the DUT. The bit files further specify partitions of the DUT created by the host system with trace and injection logic, mappings of the partitions to the FPGAs of the emulator, and design constraints. Based on the bit files, the emulator configures the FPGAs to perform the functions of the DUT. With some emulators, one or more FPGAs of an emulator already have the trace and injection logic built into the silicon of the FPGA. For this type of emulator, the FPGAs don't have to be configured by the host system to emulate trace and injection logic.

The host system 3110 receives (e.g., from a user) a description of a DUT that is to be emulated. In one embodiment, the DUT description is in a hardware description language (HDL), such as register transfer language (RTL). In another embodiment, the DUT description is in netlist level files, or a mix of netlist level files and HDL files. If part of the DUT description or the entire DUT description is in a HDL, the host system synthesizes the DUT description to create a gate level netlist based on the DUT description. A host system can use the netlist of the DUT to partition the DUT into multiple partitions, with some of these partitions including trace and injection logic. The trace and injection logic traces interface signals exchanged via the interfaces of an FPGA. Additionally, the trace and injection logic can be used to inject traced interface signals into the logic of the FPGA. The host system maps each partition to an FPGA of the emulator. With some emulators, the trace and injection logic is only included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic was incorporated, the bit files also describe the incorporation of the logic. The bit files may also include place and route information and design constraints. The host system stores the bit files and also stores for components of the DUT information describing which FPGAs are to emulate each component of the DUT (to which FPGAs each component is mapped).

Upon request, the host system transmits the bit files to the emulator. The host system instructs the emulator to emulate the DUT. During emulation of the DUT or at the end of the emulation, the host system receives emulation results from the emulator through the emulation connection. Emulation results are data and information generated by the emulator based on the emulation of the DUT. The emulation results include interface signals (states of interface signals) traced by the trace and injection logic of each FPGA. The host system can stores the emulation results, or transmit them to another processing system.

After emulation of the DUT, a user may request to debug a component of the DUT. If such a request is made the user may provide a time period of the emulation to debug. The host system identifies which FPGAs are configured to emulate the component based on the stored information. The host system retrieves stored interface signals associated with the time period and traced by the trace and injection logic of each identified FPGA. The host system instructs the emulator to re-emulate the identified FPGAs, either one by one, multiple at a time, or altogether. The host system transmits the retrieved interface signals to the emulator in order to re-emulate the component for the time period. The trace and injection logic of each identified FPGA injects its respective interface signals received from the host system into the logic of the DUT mapped to the FPGA. In case of multiple re-emulations of an FPGA, the results may be merged all together to have a full debug view.

The host system receives from the emulator signals traced by logic of the identified FPGAs during the re-emulation of the component. The host system stores the signals received from the emulator. The signals traced during the re-emulation can have a higher sampling rate than during the initial emulation. For example, in the initial run a traced signal may be comprised of a saved hardware state every X milliseconds. However, in the re-emulation the traced signal may be comprised of a saved hardware state every Y milliseconds, where Y is less than X. If the user requests to view a waveform of a signal traced during the re-emulation, the host system can retrieve the stored signal and display a plot of the signal (generates a waveform of the signal). Afterwards the user can, for example, request to re-emulate the same component but for a different time period or to re-emulate another component.

A host system typically comprises at least seven sub-systems: a design synthesizer, a mapping module, a run time module, a results module, a debug module, a waveform module, and a storage module. Each of these sub-systems may be embodied as hardware, software, firmware, or a combination thereof. Together these components configure the emulator, and monitor the emulation results.

The design synthesizer converts the HDL of a DUT into gate level logic. For a DUT that is to be emulated, the design synthesizer receives a description of the DUT. If the description of the DUT is fully or partially in HDL (e.g., RTL or other level of abstraction), the design synthesizer 3210 synthesizes the HDL of the DUT to create a gate-level netlist with a description of the DUT in terms of gate level logic.

The mapping module partitions DUTs and maps partitions to emulator FPGAs. The mapping module partitions a DUT at the gate level into a number of partitions using the netlist of the DUT. For each partition, the mapping module retrieves a gate level description of the trace and injection logic and incorporates the logic into the partition. As described above, the trace and injection logic included in a partition is configured to trace signals exchanged via the interfaces of an FPGA to which the partition is mapped (trace interface signals). The trace and injection logic can be incorporated into the DUT prior to the partitioning. For example, the trace and injection logic may be incorporated by the design synthesizer prior to or after the synthesizing the HDL of the DUT. Hence, the trace and injection logic may not match the partitions, it may be a subset, a superset or even different from the partitions.

In addition to including the trace and injection logic, the mapping module may include additional tracing logic in a partition in order to trace the states of certain DUT components that are not traced by the trace and injection logic (to trace signals other than the interface signals traced by the trace and injection logic). The mapping module may include the additional tracing logic in the DUT prior to the partitioning or in partitions after the partitioning. The design synthesizer can include the additional tracing logic in an HDL description of the DUT prior to synthesizing the description.

The mapping module maps each partition of the DUT to an FPGA of the emulator. The mapping module performs the partitioning and mapping using design rules, design constraints (e.g., timing or logic constraints), and information about the emulator. For components of the DUT, the mapping module stores information in the storage module describing which FPGAs are to emulate each component.

Based on the partitioning and the mapping, the mapping module generates one or more bit files that describe the created partitions and the mapping of logic to each FPGA of the emulator. The bit files may include additional information, such as constraints of the DUT, and routing information of connections between FPGAs and connections within each FPGA. The mapping module can generate a bit file for each partition of the DUT, which can be stored in the storage module. Upon request from a user, the mapping module transmits the bit files to the emulator, which the emulator uses to configure the FPGAs to emulate the DUT.

If the emulator includes specialized ASICs that include the trace and injection logic, the mapping module may generate a specific configuration allowing to connect them to the DUT or just save the information of what traced/injected signal is and where the information is stored on the specialized ASIC.

The run time module controls emulations performed on the emulator. The run time module may cause the emulator to start or stop executing an emulation. Additionally, the run time module may provide input signals/data to the emulator. The input signals may be provided directly to the emulator through the connection or indirectly through other input signal devices. For example, the host system with the run time module may control an input signal device to provide the input signals to the emulator. The input signal device may be, for example, a test board (directly or through cables), signal generator, another emulator, or another host system.

The results module processes emulation results generated by the emulator. During emulation and/or after completing the emulation, the results module receives emulation results from the emulator generated during the emulation. The emulation results include signals traced during the emulation. Specifically, the emulation results include interface signals traced by the trace and injection logic emulated by each FPGA. The emulation results may also include signals traced by additional logic included in the DUT. Each traced signal can span multiple cycles of the emulation. A traced signal is comprised of multiple hardware states and each hardware state is associated with a time of the emulation. The results module stores the traced signals received in the storage module. For each stored signal, the results module can store information indicating which FPGA generated the traced signal.

The debug module allows users to debug DUT components. After the emulator has emulated a DUT and the results module has received the interface signals traced by the trace and injection logic during the emulation, a user may request to debug a component of the DUT by re-emulating the component for a specific time period. In a request to debug a component, the user identifies the component and indicates a time period of the emulation to debug. The user's request can also include a sampling rate that indicates how often hardware states should be saved by logic that traces signals.

The debug module identifies the one or more FPGAs of the emulator that are configured to emulate the component based on the information stored by the mapping module in the storage module. For each identified FPGA, the debug module retrieves, from the storage module, interface signals traced by the trace and injection logic of the FPGA during the time period indicated by the user (i.e., retrieve hardware states traced by the trace and injection logic that are associated with the time period).

The debug module transmits the retrieved interface signals to the emulator. The debug module instructs the debug module to run the identified FPGAs and for the trace and injection logic of each identified FPGA to inject its respective traced signals into logic of the FPGA in order to re-emulate the component for the requested time period. The debug module can also transmit the sampling rate provided by the user to the emulator so that the tracing logic traces hardware states at the proper intervals.

To debug the component, the emulator only has to run the FPGAs to which the component has been mapped. Additionally, the re-emulation of the component does not have to start from the beginning, but can start at any point desired by the user.

For an identified FPGA, the debug module can transmit instructions to the emulator to load multiple emulator FPGAs with the same configuration of the identified FPGA. The debug module additionally instructs the emulator to run the multiple FPGAs in parallel. Each FPGA from the multiple FPGAs is run with a different time window of the interface signals in order to generate a larger time window in a shorter amount of time. For example, for the identified FPGA to run a certain amount of cycles it may take an hour. However, if multiple FPGAs are loaded with the configuration of the identified FPGA and each of the FPGAs runs a subset of the cycles, it may only take a few minutes for the FPGAs to collectively run all of the cycles.

A user may identify a hierarchy or a list of DUT signals to re-emulate. To enable this, the debug module determines the FPGA needed to emulate the hierarchy or list of signals, retrieves the necessary interface signals and transmits the retrieved interface signals to the emulator for re-emulation. Hence, a user can identify any element (e.g., component or signal) of the DUT to debug/re-emulate.

The waveform module generates waveforms based on traced signals. If a user requests to view a waveform of a signal traced during an emulation run, the host system retrieves the signal from the storage module. The waveform module displays a plot of the signal to the user. For one or more signals, when the signals are received from the emulator, the waveform module can automatically generate the plots of the signals.

DETAILED DESCRIPTION—SEMANTIC SUPPORT

The signifier 'commercial solution' signifies, solely for the following paragraph, an engineering domain-specific (and thus non-preemptive—see Bilski) electronic structure, process for specified machines, manufacturable circuit (and their Church-Turing equivalents) or composition of matter that is useful in commerce to solve a problem of technology, that is, a use in commerce of an application of science or use in commerce of technology.

The signifier 'abstract' (when used in a patent claim for any embodiments disclosed herein for a new commercial solution that is a scientific application of one or more laws of nature {see Benson}, and that solves a problem of technology {see Diehr} used in commerce—or improves upon an existing commercial solution {see Diehr})—is precisely defined by the inventor(s) {see MPEP 2111.01} as follows:

a) a new commercial solution is 'abstract' if it is not novel (e.g., it is so well known in equal prior art {see Alice} and/or the use of equivalent prior art solutions is long prevalent {see Bilski} in science, engineering or commerce), and thus unpatentable under 35 U.S.C. 102, for example, because it is "difficult to understand" {see Merriam-Webster definition for 'abstract'} how the commercial solution differs from equivalent prior art solutions; or b) a new commercial solution is 'abstract' if it is obvious, that is, if the existing prior art includes at least one analogous prior art solution {see KSR}, or the existing prior art includes at least two prior art items that can be combined {see Alice} by a person having ordinary skill in the art {a "PHOSITA", see MPEP 2141-2144} to be equivalent to the new commercial solution, and is thus unpatentable under 35 U.S.C. 103, for example, because it is "difficult to understand" how the new commercial solution differs from a PHOSITA-combination/-application of the existing prior art; or c) a new commercial solution is 'abstract' if it is not disclosed with an enabling description either because there is insufficient guidance in the enabling description, or because only a generic implementation is described {see Mayo} with unspecified elements, parameters or functionality, so that a PHOSITA is unable to instantiate a useful embodiment of the new commercial solution, without, for example, requiring special programming {see Katz} or circuit design to be performed by the PHOSITA), and is thus unpatentable under 35 U.S.C. 112, for example, because it is "difficult to understand" how to use in commerce any embodiment of the new commercial solution.

DETAILED DESCRIPTION—CONCLUSION

The foregoing Detailed Description signifies in isolation the individual features, structures, functions, or characteristics described herein and any combination of two or more such features, structures, functions or characteristics, to the extent that such features, structures, functions or characteristics or combinations thereof are based on the present specification as a whole in light of the knowledge of a person skilled in the art, irrespective of whether such features, structures, functions or characteristics, or combinations thereof, solve any problems disclosed herein, and without limitation to the scope of the claims. When an embodiment of a claimed invention comprises a particular feature, structure, function or characteristic, it is within the knowledge of a person skilled in the art to use such feature, structure, function, or characteristic in connection with other embodiments whether or not explicitly described, for example, as a substitute for another feature, structure, function or characteristic.

In view of the foregoing Detailed Description it will be evident to a person skilled in the art that many variations may be made within the scope of innovations, embodiments and/or examples, such as function and arrangement of elements, described herein without departing from the principles described herein. One or more elements of an embodiment may be substituted for one or more elements in another embodiment, as will be apparent to those skilled in the art. The embodiments described herein are chosen to signify the principles of the invention and its useful application, thereby enabling others skilled in the art to understand how various embodiments and variations are suited to the particular uses signified.

The foregoing Detailed Description of innovations, embodiments, and/or examples of the claimed inventions has been provided for the purposes of illustration and description. It is not intended to be exhaustive nor to limit the claimed inventions to the precise forms described but is to be accorded the widest scope consistent with the principles and features disclosed herein. Obviously, many variations will be recognized by a person skilled in this art. Without limitation, any and all equivalents described, signified or incorporated by reference in this patent application are specifically incorporated by reference into the description herein of the innovations, embodiments and/or examples. In addition, any and all variations described, signified or incorporated by reference herein with respect to any one embodiment are also to be considered taught with respect to all other embodiments. Any such variations include both currently known variations as well as future variations, for example any element used herein includes a future equivalent element that provides the same function, regardless of the structure of the future equivalent.

It is intended that the scope of the claimed inventions be defined and judged by the following claims and equivalents. The following claims are hereby incorporated into the Detailed Description, with each claim standing on its own as a separate embodiment. Disclosed embodiments can be described with more features than are expressly recited in the claims.

What is claimed is:

1. A method comprising:
performing placement of a netlist associated with a first circuit design by a place and route device;
delivering a first list of features associated with the placed netlist to a processing device;
performing a global route of the first circuit design by a global router;
delivering a second list of features from the global router to the processing device;
performing a detailed route of the first circuit design by a detailed router;
providing a label associated with each of a plurality of library cells in the first circuit design to the processing device;
training the processing device using the first and second list of features and the labels; and
upsampling a subset of the labels.

2. The method of claim 1 wherein said first list comprises one or more of a number of buried nets, number of non-buried nets, pin proximity, number of flip-flops, pin density, cell density, power distribution network, via pillar density, number of nets with non-default rules, number of nets on critical paths.

3. The method of claim 2 wherein said second list comprises one or more of a number of nets to route in a region, capacity of nets to route in a region, a difference between the number of nets to route in a region and the capacity of the nets to route in the region, and an anchor point.

4. The method of claim 1 further comprising:
using the trained processing device to predict a number of design rules violations of a second circuit design.

5. The method of claim 1 further comprising:
normalizing one or more of a subset of features of the first feature list and the second feature list to scale values of the features in the subset.

6. The method of claim 5 further comprising:
categorizing the plurality of library cells based on a number of design rules violations associated with the plurality of library cells.

7. The method of claim 1 further comprising:
eliminating features, from one or more of the first list and the second list, whose variations is smaller than a first value.

8. The method of claim 7 further comprising:
selecting features, from one or more of the first list and the second list, whose degree of correlations with the design rules violations is greater than a second value.

9. The method of claim 8 further comprising:
training the processing device using the selected features.

10. The method of claim 9 further comprising:
integrating the processing device with the place and route device.

11. The method of claim 9 further comprising:
using the processing device to determine an expansion factor of at least a subset of the plurality of library cells disposed in the design.

12. A system comprising:
a memory storing instructions; and
a processor, coupled with the memory and to execute the instructions, the instructions when executed cause the processor to:
receive a first list of features associated with a placed netlist of a first circuit design comprising a plurality of library cells;
receive a second list of features from a global router performing a global route of the first circuit design;
receive a label associated with each of the plurality of library cells in the first circuit design from a detailed router performing a detailed route of the design;
predict a number of design rules violations of the first circuit design in accordance with the received first and second lists and the labels; and
upsample a subset of the labels.

13. The system of claim 12 wherein said first list comprises one or more of a number of buried nets, number of non-buried nets, pin proximity, number of flip-flops, pin density, cell density, power distribution network, via pillar density, number of nets with non-default rules, number of nets on critical paths of the first circuit design.

14. The system of claim 13 wherein said second list comprises one or more of a number of nets to route in a region, capacity of nets to route in a region, a difference between the number of nets to route in a region and the capacity of the nets to route in the region, and an anchor point of the first circuit design.

15. The system of claim 12 wherein the system is further configured to:
predict a number of design rules violations of a second circuit design.

16. The system of claim 12 wherein the system is further configured to:
normalize one or more of a subset of features of the first feature list and the second feature list to scale values of the features in the subset.

17. The system of claim 16 wherein the system is further configured to:
categorize the the plurality of library cells based on a number of design rules violations associated with the plurality of library cells.

18. The system of claim 12 wherein the system is further configured to:
eliminate features, from one or more of the first list and the second list, whose variations is smaller than a first value.

19. The system of claim 18 wherein the system is further configured to:
select features, from one or more of the first list and the second list, whose degree of correlations with the design rules violations is greater than a second value.

20. The system of claim 19 wherein the system is integrated with the place and route device.

21. The system of claim 19 wherein the system is further configured to:
determine an expansion factor of at least a subset of the plurality of library cells disposed in the design.

22. A non-transitory computer readable medium comprising stored instructions, which when executed by a processor, cause the processor to:
perform placement of a netlist associated with a first circuit design;
receive a first list of features associated with the placed netlist;
perform a global route of the first circuit design;
receive a second list of features;
perform a detailed route of the first circuit design by a detailed router;
receive a label associated with each of a plurality of library cells in the first circuit design;
predict a number of design rules violations of the first circuit design in accordance with the received first and second lists and the labels;
select features, from one or more of the first list and the second list, whose degree of correlations with the design rules violations is greater than a first value.

23. The non-transitory computer readable medium of claim 22 wherein the first list comprises one or more of a number of buried nets, number of non-buried nets, pin proximity, number of flip-flops, pin density, cell density, power distribution network, via pillar density, number of nets with non-default rules, number of nets on critical paths of the first circuit design.

24. The non-transitory computer readable medium of claim 23 wherein the second list comprises one or more of a number of nets to route in a region, capacity of nets to route in a region, a difference between the number of nets to route in a region and the capacity of the nets to route in the region, and an anchor point of the first circuit design.

25. The non-transitory computer readable medium of claim 22 wherein the instructions further cause the processor to:
predict a number of design rules violations of a second circuit design.

26. The non-transitory computer readable medium of claim 22 wherein the instructions further cause the processor to:
normalize one or more of a subset of features of the first feature list and the second list to scale values of the features in the subset.

27. The non-transitory computer readable medium of claim 22 wherein the instructions further cause the processor to categorize the plurality of library cells based on a number of design rules violations associated with the plurality of library cells.

28. The non-transitory computer readable medium of claim 22 wherein said instructions further cause the processor to:
eliminate features, from one or more of the first list and the second list, whose variations is smaller than a first value.

29. The non-transitory computer readable medium of claim 22 wherein the processor is integrated with a place and route device.

* * * * *